(12) United States Patent
Leipold et al.

(10) Patent No.: US 10,062,494 B2
(45) Date of Patent: Aug. 28, 2018

(54) APPARATUS WITH 3D INDUCTORS

(71) Applicant: RF Micro Devices, Inc., Greensboro, NC (US)

(72) Inventors: Dirk Robert Walter Leipold, San Jose, CA (US); George Maxim, Saratoga, CA (US); Marcus Granger-Jones, Scotts Valley, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/929,608

(22) Filed: Nov. 2, 2015

(65) Prior Publication Data

US 2016/0126007 A1    May 5, 2016
US 2017/0365394 A9    Dec. 21, 2017

Related U.S. Application Data

(60) Provisional application No. 62/074,446, filed on Nov. 3, 2014.

(51) Int. Cl.
| | |
|---|---|
| *H01F 27/28* | (2006.01) |
| *H01F 17/00* | (2006.01) |
| *H04J 1/08* | (2006.01) |
| *H03H 7/46* | (2006.01) |
| *H03H 7/38* | (2006.01) |
| *H04B 1/40* | (2015.01) |

(52) U.S. Cl.
CPC ........... *H01F 27/2804* (2013.01); *H03H 7/38* (2013.01); *H03H 7/463* (2013.01); *H04B 1/40* (2013.01); *H04J 1/08* (2013.01); *H01F 2027/2809* (2013.01)

(58) Field of Classification Search
CPC .................... H01F 17/0013; H01F 2027/2809
See application file for complete search history.

(56) References Cited

U.S. PATENT DOCUMENTS

| | | |
|---|---|---|
| 4,205,286 A | 5/1980 | Parish |
| 4,459,571 A | 7/1984 | Fraser |
| 5,478,773 A | 12/1995 | Dow et al. |

(Continued)

OTHER PUBLICATIONS

Notice of Allowance and Examiner-Initiated Interview Summary for U.S. Appl. No. 14/931,621, dated Jan. 4, 2017, 10 pages.

(Continued)

*Primary Examiner* — Elvin G Enad
*Assistant Examiner* — Malcolm Barnes
(74) *Attorney, Agent, or Firm* — Withrow & Terranova, P.L.L.C.

(57) ABSTRACT

Embodiments of an apparatus are disclosed that includes a first three dimensional (3D) inductor and a second 3D inductor. The first three dimensional (3D) inductor has a first conductive path shaped as a first two dimensional (2D) lobe laid over a first 3D volume. In addition, the second 3D inductor has a second conductive path, wherein the second 3D inductor is inserted into the first 3D inductor so that the second conductive path at least partially extends through the first 3D volume. Since second 3D inductor is inserted into the first 3D inductor, the 3D inductors may be coupled to one another. Depending on orientation and distances of structures provided by the 3D inductors, the 3D inductors may be weakly or moderately coupled.

20 Claims, 9 Drawing Sheets

(56) References Cited

U.S. PATENT DOCUMENTS

| | | | | |
|---|---|---|---|---|
| 6,031,445 | A * | 2/2000 | Marty | H01F 27/2804 336/200 |
| 6,291,872 | B1 * | 9/2001 | Wang | H01F 17/0013 257/531 |
| 6,833,781 | B1 * | 12/2004 | Padmanabhan | H01F 17/0033 336/200 |
| 8,212,155 | B1 * | 7/2012 | Wright | H01L 23/00 336/200 |
| 8,325,001 | B2 * | 12/2012 | Huang | H01F 17/0013 336/200 |
| 2004/0212038 | A1 * | 10/2004 | Ott | H01F 17/0033 257/531 |
| 2005/0082669 | A1 | 4/2005 | Saijo et al. | |
| 2006/0262820 | A1 | 11/2006 | Itoh et al. | |
| 2008/0002380 | A1 * | 1/2008 | Hazucha | H01L 23/645 361/760 |
| 2008/0297299 | A1 * | 12/2008 | Yun | H01F 17/0013 336/200 |
| 2011/0090036 | A1 * | 4/2011 | Kuroda | H01F 17/0013 336/199 |
| 2014/0266544 | A1 * | 9/2014 | Leipold | H01F 5/003 336/200 |
| 2014/0323046 | A1 * | 10/2014 | Asai | H01Q 1/2283 455/41.2 |
| 2015/0035637 | A1 | 2/2015 | Maxim et al. | |
| 2015/0279921 | A1 * | 10/2015 | Lam | H01L 28/10 257/531 |
| 2016/0013667 | A1 * | 1/2016 | Hosotani | H01F 27/2804 307/104 |
| 2016/0020013 | A1 * | 1/2016 | Berdy | H01F 27/2804 336/200 |
| 2016/0156390 | A1 * | 6/2016 | Kuroda | H01F 27/2804 257/531 |

OTHER PUBLICATIONS

Supplemental Notice of Allowability for U.S. Appl. No. 14/931,621, dated Apr. 14, 2017, 4 pages.
Non-Final Office Action for U.S. Appl. No. 14/931,689, dated Apr. 6, 2017, 8 pages.
Notice of Allowance for U.S. Appl. No. 14/931,689, dated Nov. 2, 2017, 8 pages.

* cited by examiner

APPARATUS WITH 3D INDUCTORS

RELATED APPLICATIONS

This application claims the benefit of provisional patent application Ser. No. 62/074,446, filed Nov. 3, 2014, the disclosure of which is hereby incorporated herein by reference in its entirety.

FIELD OF THE DISCLOSURE

This disclosure relates generally to inductive structures for radio frequency (RF) filtering circuitry.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

Embodiments of an apparatus are disclosed that includes a first three dimensional (3D) inductor and a second 3D inductor. The first three dimensional (3D) inductor has a first conductive path shaped as a first two dimensional (2D) lobe laid over a first 3D volume. In addition, the second 3D inductor has a second conductive path, wherein the second 3D inductor is inserted into the first 3D inductor so that the second conductive path at least partially extends through the first 3D volume. Since second 3D inductor is inserted into the first 3D inductor, the 3D inductors may be coupled to one another. Depending on orientation and distances of structures provided by the 3D inductors, the 3D inductors may be weakly or moderately coupled.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Throughout this disclosure, relative terminology, such as "approximately," "substantially," and the like, may be used in a predicate to describe features and relationships between features of a device or method. The relative terminology in the predicate should be interpreted sensu lato. However, whether the predicate employing the relative terminology is satisfied is determined in accordance with error ranges and/or variation tolerances relevant to the predicate and prescribed to the device or method by RF communication standards relevant to the RF application(s) employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for the device or method can be deduced or inferred.

Throughout this disclosure "weakly magnetically coupled" and/or "weak magnetic coupling" shall mean that a magnetic coupling coefficient between magnetically coupled components that is within a range of approximately 0.0001 to approximately 0.4.

Figure 1:
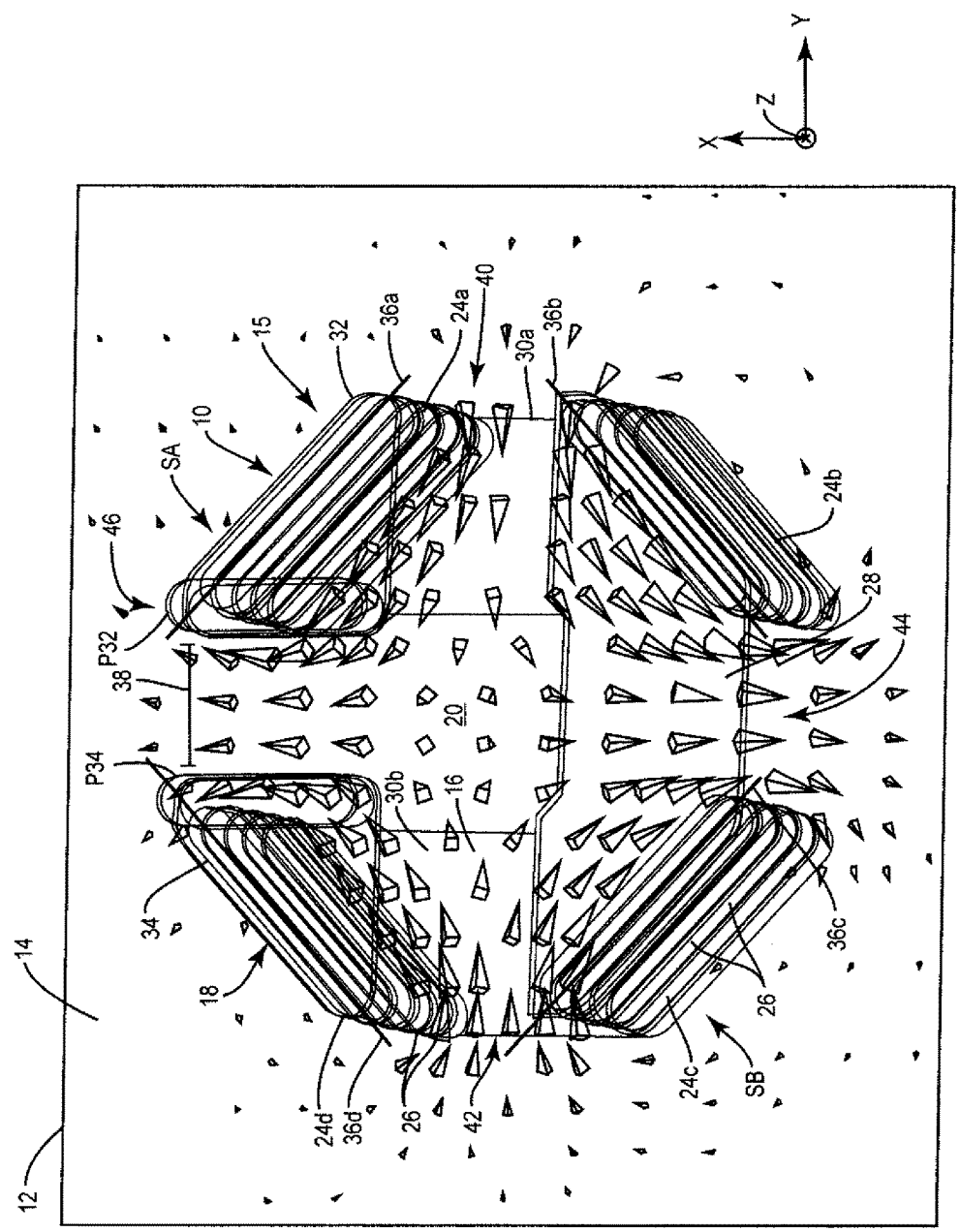
FIG. 1 illustrates one embodiment of a 3D inductor and the magnetic field generated by the 3D inductor in response to a current.

FIG. 1 illustrates one embodiment of a 3D inductor 10 created in a substrate 12. The substrate 12 has a substrate body 14 and a conductive structure 15 that is integrated into the substrate body 14. The 3D inductor 10 is formed as part of the conductive structure 15 on and within the substrate body 14. The substrate body 14 is made from suitable non-conductive material(s) and/or semiconductor material(s). Exemplary non-conductive materials include laminate, a semiconductor material, glass, a dielectric, plastic, fiber, and/or the like. Exemplary semiconductor materials include Silicon (Si), Silicon Germanium (SiGe), Gallium Arsenide (GaAs), Indium Phosphorus (InP), and/or the like. The substrate 12 may also be single layered or multi-layered. The conductive structure 15 may be formed on and/or within the substrate body 14 using any type of suitable conductive material(s). These conductive materials may be made from any type of metal(s) including, for example, copper (Cu), gold (Au), silver (Ag), Nickel (Ni), metallic alloys, and/or the like. Conductive materials may also be non-metallic conductive materials (e.g., graphene). In this embodiment, the substrate 12 is a multi-layered substrate, and the substrate body 14 is made from a laminate. The multi-layered substrate 12 thus includes the substrate body 14, which is formed from a plurality of laminated substrate layers and conductive structure 15, formed by metallic layers and conductive vias on and between the laminated substrate layers. The laminated substrate layers may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like.

While the specific embodiments described in this disclosure are implemented using a multi-layered substrate, the 3D inductor 10 described herein is not limited to multi-layered substrates. Alternatively, the 3D inductor 10 may be implemented using single-layered substrates.

With regard to the 3D inductor 10 shown in FIG. 1, the 3D inductor 10 provides a conductive path 16. The conductive path 16 extends in all three dimensions but curves back in on itself. More specifically, the conductive path 16 has a shape corresponding to a two-dimensional (2D) lobe 18 laid over a three-dimensional (3D) volume 20. In this embodiment, the 2D lobe 18 is approximately shaped as a square (which is a special case of a polygon), and the 3D volume 20 is approximately shaped as a cube (which is a special case of a polynoid). However, as explained in U.S. patent application Ser. No. 14/450,156 filed Aug. 1, 2014, now U.S. Pat. No. 9,899,133, which is hereby incorporated herein by reference in its entirety, the 2D lobe 18 and 3D volume 20 may each be of any 2D shape and 3D shape, respectively.

Note that the 2D lobe 18 is not a 2D structure but is rather a 3D structure, since the 2D lobe 18 is laid over the 3D volume 20. In other words, the 2D lobe 18 would be a 2D structure if the 2D lobe 18 where laid over a 2D plane. However, the 2D lobe 18 is a 3D structure because the 3D volume 20 provides a 3D manifold, and the 2D lobe 18 is folded onto the 3D volume 20. The 2D lobe 18 may be any conductive structure that is at least partially bounded so as to form a loop, since the 2D lobe 18 curves back in on itself. In other words, the face of the 2D lobe 18 has been bent so that at the 2D lobe 18 surrounds a perimeter of a 3D area at the boundary of the 3D volume 20.

To form the conductive path 16, the 3D inductor 10 comprises four elongated via columns (referred to generically as element 24, and specifically as elongated via columns 24a, 24b, 24c, and 24d). Each of the elongated via columns 24 is formed by a stack of solid via bars 26. Also, to form the conductive path 16, the 3D inductor 10 of FIG. 1 also comprises three connector plates 28, 30a, and 30b. The connector plate 28 connects the elongated via column 24b to the elongated via column 24c on a first vertical side SA of the 3D inductor 10. On a second vertical side SB of the 3D inductor 10 that is antipodal to the first vertical side SA, the connector plate 30a connects the elongated via column 24a to the elongated via column 24b, and the connector plate 30b connects the elongated via column 24c to the elongated via column 24d. The 3D inductor 10 of FIG. 1 further comprises two terminal plates 32 and 34 to form part of the conductive path 16. The terminal plates 32 and 34 comprise a terminal connection for the 3D inductor 10 and are connected to the elongated via columns 24a, 24d, respectively, at the first vertical side SA. The terminal plates 32 and 34 can be connected to ports P32 and P34, respectively, for connection to an external component, such as, but not limited to, a tunable capacitor.

Current from the port P32 flows to and across the terminal plate 32 down the elongated via column 24a to the connector plate 30a. The current flow continues across the connector plate 30a up through the elongated via column 24b to the connector plate 28. The current flow then continues across the connector plate 28 down through the elongated via column 24c to the connector plate 30b. The current flow continues up through the elongated via column 24d to the terminal plate 34 and up through the port P34.

Note that the solid via bars 26 are elongated, and thus each of the elongated via columns 24 are elongated relative to a plane. Accordingly, the elongated via column 24a is elongated with respect to a plane 36a, the elongated via column 24b is elongated with respect to a plane 36b, the elongated via column 24c is elongated with respect to a plane 36c, and the elongated via column 24d is elongated with respect to a plane 36d. Thus, a cross sectional horizontal area of each of the elongated via columns 24 has a major axis longer than a minor axis. Note also that each of the connector plates 28, 30a, 30b are each shaped as a trapezoid where the exterior parallel edge of each the connector plates 28, 30a, 30b provides the short base of the trapezoid, while the interior parallel edge of each of the connector plates 28, 30a, 30b provides the long base of the trapezoid. The opposite disposed end edges of each the connector plates 28, 30a, 30b provide the legs of the trapezoid. In this case, each of the connector plates 28, 30a, 30b is shaped as an isosceles trapezoid where an angle between each of the legs to the long base is approximately 45 degrees while an angle between each of the legs and the short base is approximately 135 degrees. Each of the elongated via columns is angled so that their respective planes 36 is substantially parallel with the end edge of the connector plates that the respective elongated via column 24 with which the elongated via column connects. Thus, each elongated via column 24 connects to the connector plates 28, 30a, 30b such that an angle between the respective plane 36 of the elongated via column 24 and the interior edge of the connector plate 28, 30a, 30b it connects to is approximately 45 degrees, while an angle between the respective plane 36 of the elongated via column 24 and the exterior edge of the connector plate 28, 30a, 30b it connects to is approximately 135 degrees. Similarly, the terminal plates 32, 34 are each shaped as trapezoids, but in this case, right trapezoids. However, the combination of the terminal plates 32, 34 would form the same trapezoid as the connector plates 28, 30a, 30b except that there is a gap between each of the right angled edges terminal plates 32, 34. Each of the angled edges of the terminal plates 32, 34 (where the terminal plates 32, 34 connect to the elongated via columns 24a, 24d) has the same angular relationship with the elongated via columns 24a, 24d as each of the connector plates 28, 30a, 30b has with the elongated via columns 24a, 24b, 24c, 24d. These angular relationships allow the conductive path 16 to wrap symmetrically in three dimensions while preventing current crowding by maintaining substantially equal current paths.

Note then that each of the elongated via columns 24 has an interior column surface and an exterior column surface oppositely disposed from one another. For each of the elongated via columns 24, the interior column surface faces toward an interior of the 3D inductor 10, while the exterior column surface faces toward an exterior of the 3D inductor 10. As shown in FIG. 1, the plane 36a and the plane 36c are substantially parallel so that an interior column surface of the elongated via column 24a and an interior column surface of the elongated via column 24c face one another. Furthermore, the plane 36b and the plane 36d are substantially parallel so that the interior column surface of the elongated via column 24b and the interior column surface of the elongated via column 24d face one another. However, the plane 36a and the plane 36c are each transverse to both the plane 36b and the plane 36d. The planes 36a, 36b, 36c, and 36d thus all intersect at vertical side SA to define a square footprint and all intersect at vertical side SB to define another square footprint.

With regard to the embodiment of the 3D inductor 10 shown in FIG. 1, the conductive path 16 of the 2D lobe 18 extends from the terminal plate 32 to the terminal plate 34. The 2D lobe 18 is open so as to define a gap 38 in the 2D lobe 18 between the terminal plate 32 and the terminal plate 34. The 2D lobe 18 is formed such that the conductive path 16 extends out of the terminal plate 32 and loops back to the terminal plate 34 back towards the gap 38. The terminal plate 32 is connected to a connecting end of the elongated via column 24a at the side SA. In this embodiment, the conductive path 16 forms a first turn 40 of the 3D inductor 10. To form the first turn 40, the connector plate 30a is connected to a connecting end of the elongated via column 24a at the side SB. Also, the connector plate 30a is connected to a connecting end of the elongated via column 24b at the vertical side SB. In this manner, the elongated via column 24a, the connector plate 30a, and the elongated via column 34b form the first turn 40. The connector plate 28 provides a bend that bounds the 2D lobe 18 so that the 2D lobe 18 curves back on itself. The connector plate 28 is connected to a connecting end of the elongated via column 24c at the vertical side SA. The conductive path 16 forms a second turn 42 of the 3D inductor 10 that loops the 2D lobe 18 back toward the gap 38 and the terminal plate 34. To form the second turn 42, the connector plate 30b is connected to a connecting end of the elongated via column 24c at the vertical side SB. The connector plate 30b is also connected to a connecting end of the elongated via column 24d at the vertical side SB. Thus, the elongated via column 34c, the connector plate 30b, and the elongated via column 34d form the second turn 42. Furthermore, note that the first turn 40 and the second turn 42 are connected to form a third turn 44. More specifically, the elongated via column 34b, the connector plate 28, and the elongated via column 34c form the third turn 44.

The magnetic field H (represented by cones in FIG. 1) is generated by the 3D inductor 10 in response to a current. The intensity and direction of the magnetic field is indicated by the size of the cones. By laying the 2D lobe 18 of the conductive path 16 of the 3D inductor 10 over the 3D volume 20, the conductive path 16 is configured to generate a magnetic field H that predominately embraces the conductive path 16 along an interior of the 3D inductor 10. Thus, the magnetic field H predominately embraces the interior surfaces of the elongated via column 24a, the elongated via column 24b, the elongated via column 24c, the elongated via column 24d, the connector plate 28, the 3D volume 20, the terminal plate 32, and the terminal plate 34. The magnetic field H gets weaker towards a geometric centroid of the 3D inductor 10. A majority of magnetic energy of the magnetic field H is stored inside the 3D inductor 10 and within the 3D volume 20. Also, the magnetic field lines of the magnetic field H are predominately destructive on an exterior of the 3D inductor 10 and the 3D volume 20 of the 3D inductor 10. The magnetic field lines of the magnetic field H are predominately destructive outside the 3D inductor 10 and the 3D volume 20 because magnetic field line subtraction dominates outside the 3D inductor 10 and the 3D volume 20 so that a minority of the magnetic energy of the magnetic field H is stored outside of the 3D inductor 10 and the 3D volume 20.

As shown in FIG. 1, the 2D lobe 18 is laid over the 3D volume 20 such that the conductive path 16 extends in three orthogonal spatial dimensions. Thus, an RF signal propagates through conductive path 16 in three orthogonal spatial dimensions, and the conductive path 16 is a 3D conductive path. As such, all three spatial dimensions are required to describe signal propagation throughout the 2D lobe 18. Direction indicators are drawn throughout the conductive path 16 to indicate directions of current propagation throughout the 3D inductor 10. The spreading of the magnetic field H in all three dimensions helps achieve weak coupling, since little energy is concentrated in any given direction.

An x-axis, a y-axis, and a z-axis are shown in FIG. 1 with an origin at a geometric centroid of the 3D inductor 10 and the 3D volume 20. As shown in FIG. 1, the first turn 40 and the second turn 42 face one another and are substantially symmetrical with respect to an x-z plane. The connector plate 28 connects the first turn 40 and the second turn 42 so that the third turn faces the y-z plane, which is traverse to the x-z plane. The 3D inductor 10 does not have symmetry with respect to the x-y plane, which is orthogonal to both the x-z plane and the y-z plane. However, on one side of the x-y plane, the 3D inductor 10 is bounded, while on another side of the x-y plane, the 3D inductor 10 is unbounded.

Due to the symmetry of the 3D inductor 10 shown in FIG. 1, the 2D lobe 18 of the 3D inductor 10 is laid over the 3D volume 20 such that most inductor segments have a corresponding inductor segment in the 3D inductor 10 such that current propagation in the inductor segments is antipodal. For instance, except for the gap 38, inductor segments in the first turn 40 located on one side of the x-z plane have a corresponding inductor segment in the second turn 42 located on the other side of the x-z plane where current propagation is antipodal. Similarly, except for the gap 38, inductor segments in the third turn 44 located on one side of the y-z plane have a corresponding inductor segment relative to a segmented fourth turn 46 located on the other side of the y-z plane. The segmented fourth turn 46 is formed by the terminal plate 32, the elongated via column 34a, the elongated via column 34d, and the terminal plate 34. Accordingly, the magnetic field lines of the magnetic field H that predominately embrace the conductive path 16 are predominately subtractive (canceling partially or completely) outside the 3D inductor 10. However, lack of symmetry with respect to the x-y plane ensures that this is not entirely the case throughout.

Figure 2:
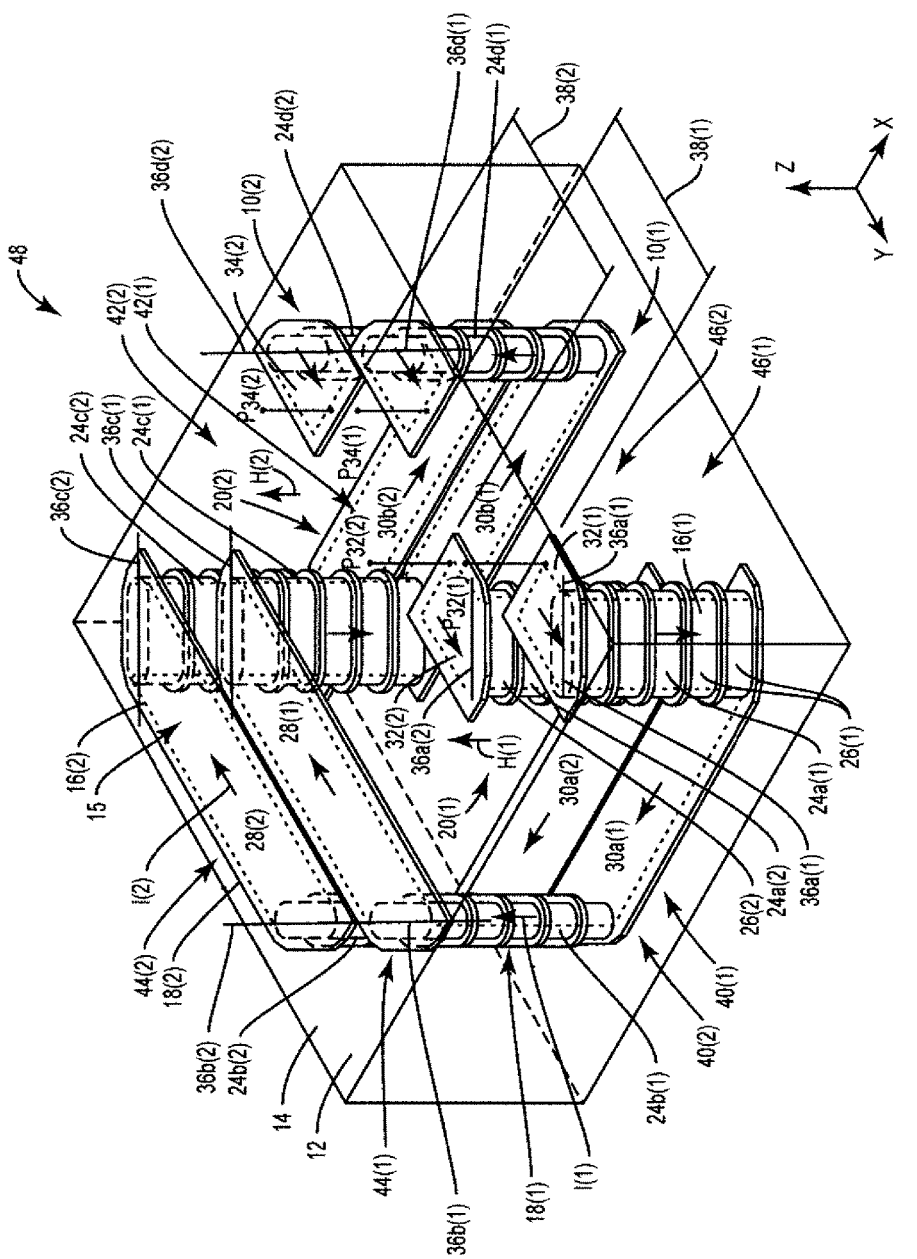
FIG. 2 illustrates an embodiment of two 3D inductors, like the 3D inductor shown in FIG. 1, that have been inserted into one another.

FIG. 2 illustrates one embodiment of an apparatus 48 formed by the conductive structure 15 of the substrate 12 shown in FIG. 1. In this embodiment, the apparatus 48 includes a 3D inductor 10(1) and a 3D inductor 10(2). The 3D inductor 10(1) is the same as the 3D inductor 10 shown in FIG. 1 such that the conductive path 16(1), the 2D lobe 18(1), the 3D volume 20(1), the elongated via column 24a(1), the elongated via column 24b(1), the elongated via column 24c(1), the elongated via column 24d(1), the solid via bars 26(1), the connector plate 28(1), the connector plate 30a(1), the connector plate 30b(1), the terminal plate 32(1), the terminal plate 34(1), the plane 36a(1), the plane 36b(1), the plane 36c(1), the plane 36d(1), the gap 38(1), the first turn 40(1), the second turn 42(1), the third turn 44(1), and the segmented fourth turn 46(1), are substantially the same as the conductive path 16, the 2D lobe 18, the 3D volume 20, the elongated via column 24a, the elongated via column 24b, the elongated via column 24c, the elongated via column 24d, the solid via bars 26, the connector plate 28, the connector plate 30a, the connector plate 30b, the terminal plate 32, the terminal plate 34, the plane 36a, the plane 36b, the plane 36c, the plane 36d, the gap 38, the first turn 40, the second turn 42, the third turn 44, and the segmented fourth turn 46 described above with respect to FIG. 1. The 3D inductor 10(2) also is the same as the 3D inductor 10 shown in FIG. 1 such that the conductive path 16(2), the 2D lobe 18(2), the 3D volume 20(2), the elongated via column 24a(2), the elongated via column 24b(2), the elongated via column 24c(2), the elongated via column 24d(2), the solid via bars 26(2), the connector plate 28(2), the connector plate 30a(2), the connector plate 30b(2), the terminal plate 32(2), the terminal plate 34(2), the plane 36a(2), the plane 36b(2), the plane 36c(2), the plane 36d(2), the gap 38(2), the first turn 40(2), the second turn 42(2), the third turn 44(2), and the segmented fourth turn 46(2), are substantially the same as the conductive path 16, the 2D lobe 18, the 3D volume 20, the elongated via column 24a, the elongated via column 24b, the elongated via column 24c, the elongated via column 24d, the solid via bars 26, the connector plate 28, the connector plate 30a, the connector plate 30b, the terminal plate 32, the terminal plate 34, the plane 36a, the plane 36b, the plane 36c, the plane 36d, the gap 38, the first turn 40, the second turn 42, the third turn 44, and the segmented fourth turn 46 described above with respect to FIG. 1.

As shown in FIG. 2, the 3D inductor 10(2) is inserted into the 3D inductor 10(1) so that the conductive path 16(2) partially extends through the 3D volume 20(1). As such, the 3D inductor 10(2) is inserted into the 3D inductor 10(1) so that 3D volume 20(2) partially overlaps the 3D volume 20(1). In this embodiment, the third turn 44(1) of the 3D inductor 10(1) and the first turn 40(2) of the 3D inductor 10(2) are interweaved so that the elongated via column 24a(2) of the conductive path 16(2) extends through the 3D volume 20(1) and the interior of the 3D inductor 10(1). As a result, the 3D inductor 10(1) is also inserted within the 3D inductor 10(2) so that the conductive path 16(1) partially extends through the 3D volume 20(2). More specifically, the second turn 42(1) is interweaved with the segmented fourth turn 46(2). Thus, the elongated via column 24c(1) extends though the 3D volume 20(2). However, the connector plate 28(2), the elongated via column 24c(2) and the elongated via column 24d(2) of the 3D inductor 10(2) are outside of the 3D volume 20(1) and at an exterior of the 3D inductor 10(1). Additionally, the elongated via column 24a(1), the connector plate 28(1), and the elongated via column 24d(1) of the 3D inductor 10(1) are outside and at an exterior of the 3D inductor 10(2).

By at inserting the 3D inductor 10(2) into the 3D inductor 10(1), the 3D inductor 10(2) can be magnetically coupled to the 3D inductor 10(1). In this embodiment, the 3D inductor 10(1) and the 3D inductor 10(2) are oriented in substantially the same manner but have a displacement relative to the x-axis and a displacement relative to the y-axis. There is no displacement with respect to the z-axis. The conductive path 16(1) is shaped as the 2D lobe 18(1) laid over the 3D volume 20(1) such that, in response to a current I(1) being provided through the conductive path 16(1), the conductive path 16(1) is configured to generate a magnetic field H(1) that predominately embraces the conductive path 16(1) along the interior of the 3D inductor 10(1), as shown by the magnetic field H described above with respect to FIG. 1. The conductive path 16(2) is shaped as the 2D lobe 18(2) laid over the 3D volume 20(2) such that, in response to a current I(2) being provided through the conductive path 16(2), the conductive path 16(2) is configured to generate a magnetic field H(2) that predominately embraces the conductive path 16(2) along the interior of the 3D inductor 10(2), in the same manner as the magnetic field H described above with respect to FIG. 1.

With respect to the embodiment shown in FIG. 2, the elongated via column 24a(1) of the 3D inductor 10(1) and the elongated via column 24a(2) of the 3D inductor 10(2) are magnetically coupled to one another. Also, the elongated via column 24c(1) of the 3D inductor 10(1) and the elongated via column 24c(2) of the 3D inductor 10(2) are magnetically coupled to one another. As shown in FIG. 2, the elongated via column 24a(1) has a first interior column surface facing toward the interior of the 3D inductor 10(1) and a first exterior column surface that faces toward the exterior of the 3D inductor 10(1). The elongated via column 24b(1) has a second interior column surface facing toward the interior of the 3D inductor 10(1) and a second exterior column surface that faces toward the exterior of the 3D inductor 10(1). The elongated via column 24c(1) has a third interior column surface facing toward the interior of the 3D inductor 10(1) and a third exterior column surface that faces toward the exterior of the 3D inductor 10(1). The elongated via column 24d(1) has a fourth interior column surface facing toward the interior of the 3D inductor 10(1) and a fourth exterior column surface that faces toward the exterior of the 3D inductor 10(1). The elongated via column 24a(2) has a fifth interior column surface facing toward an interior of the 3D inductor 10(2) and a fifth exterior column surface that faces toward an exterior of the 3D inductor 10(2). The elongated via column 24b(2) has a sixth interior column surface facing toward the interior of the 3D inductor 10(2) and a sixth exterior column surface that faces toward the exterior of the 3D inductor 10(2). The elongated via column 24c(2) has a seventh interior column surface facing toward the interior of the 3D inductor 10(2) and a seventh exterior column surface that faces toward the exterior of the 3D inductor 10(2). Finally, the elongated via column 24d(2) has an eighth interior column surface facing toward the interior of the 3D inductor 10(2) and a eighth exterior column surface that faces toward the exterior of the 3D inductor 10(2).

As mentioned above, the elongated via column 24a(1) of the 3D inductor 10(1) and the elongated via column 24a(2) of the 3D inductor 10(2) are magnetically coupled to one another. To do this, the first interior column surface of the elongated via column 24a(1) of the 3D inductor 10(1) faces the fifth exterior column surface of the elongated via column 24a(2) of the 3D inductor 10(2). Thus, note that the first plane 36a(1) and the first plane 36a(2) are substantially parallel to one another. The magnetic field H(1) is generated so as to embrace the interior of the 3D inductor 10(1), as described above with respect to the magnetic field H shown in FIG. 1. Accordingly, an x-y displacement between the first interior column surface of the elongated via column 24a(1) of the 3D inductor 10(1) and the fifth exterior column surface of the elongated via column 24a(2) of the 3D inductor 10(2) determines an amount of magnetic coupling between the elongated via column 24a(1) of the 3D inductor 10(1) and the elongated via column 24a(2) of the 3D inductor 10(2).

Also, the elongated via column 24c(1) of the 3D inductor 10(1) and the elongated via column 24c(2) of the 3D inductor 10(2) are magnetically coupled to one another. To do this, the third exterior column surface of the elongated via column 24c(1) of the 3D inductor 10(1) faces the seventh interior column surface of the elongated via column 24c(2) of the 3D inductor 10(2). Thus, note that the third plane 36c(1) and the third plane 36c(2) are substantially parallel to one another. The magnetic field H(2) is generated so as to embrace the interior of the 3D inductor 10(2), as described above with respect to the magnetic field H shown in FIG. 1. Accordingly, an x-y displacement between the third exterior column surface of the elongated via column 24c(1) of the 3D inductor 10(1) and the seventh interior column surface of the elongated via column 24c(2) of the 3D inductor 10(2) determines an amount of magnetic coupling between the elongated via column 24c(1) of the 3D inductor 10(1) and the elongated via column 24c(2) of the 3D inductor 10(2). Note that in FIG. 2, the first plane 36a(1), the first plane 36a(2), the third plane 36c(1), and the third plane 36c(2) all face one another and are oriented in the same manner. More specifically a common diagonal can be drawn to intersect each of the first plane 36a(1), the first plane 36a(2), the third plane 36c(1), and the third plane 36c(2) in a substantially perpendicular manner.

The elongated via column 24b(1) and the elongated via column 24b(2) are adjacent to one another. However, the elongated via column 24b(1) and the elongated via column 24b(2) do not provide significant coupling. Rather, the second plane 36b(1) of elongated via column 24b(1) and the second plane 36b(2) of the elongated via column 24b(2) are oriented in substantially the same manner. As such, the second interior column surface of elongated via column 24b(1) and the sixth interior column surface of elongated via column 24b(2) are oriented in substantially the same manner, and the second exterior column surface of elongated via column 24b(1) and the sixth exterior column surface of elongated via column 24b(2) are oriented in substantially the same manner. Therefore, the elongated via column 24b(1) and the elongated via column 24b(2) have each of their thin sides next to one another, which does not provide significant coupling.

The elongated via column 24d(1) and the elongated via column 24d(2) are adjacent to one another. However, the elongated via column 24d(1) and the elongated via column 24d(2) do not provide significant coupling. Rather, the fourth plane 36d(1) of elongated via column 24d(1) and the fourth plane 36d(2) of the elongated via column 24d(2) are oriented in substantially the same manner. As such, the fourth interior column surface of elongated via column 24d(1) and the eighth interior column surface of elongated via column 24d(2) are oriented in substantially the same manner, and the fourth exterior column surface of elongated via column 24d(1) and the eighth exterior column surface of elongated via column 24d(2) are oriented in substantially the same manner. Therefore, the elongated via column 24d(1) and the elongated via column 24d(2) have each of their thin sides next to one another, which does not provide significant coupling.

Figure 3A:
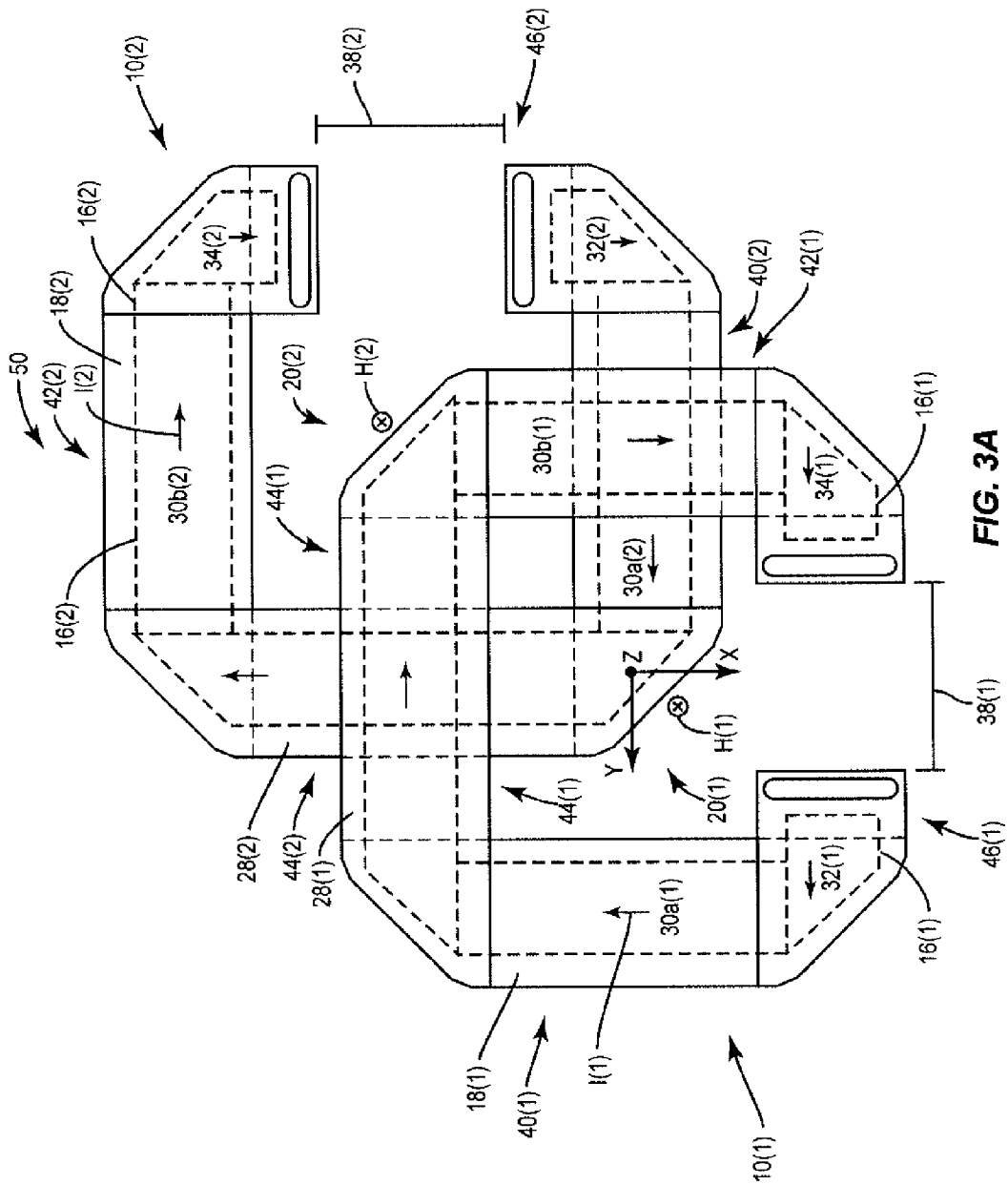
FIG. 3A and FIG. 3B illustrate an embodiment of two 3D inductors, like the 3D inductor shown in FIG. 1, that have been inserted into one another, but with a different orientation.
Figure 3B:
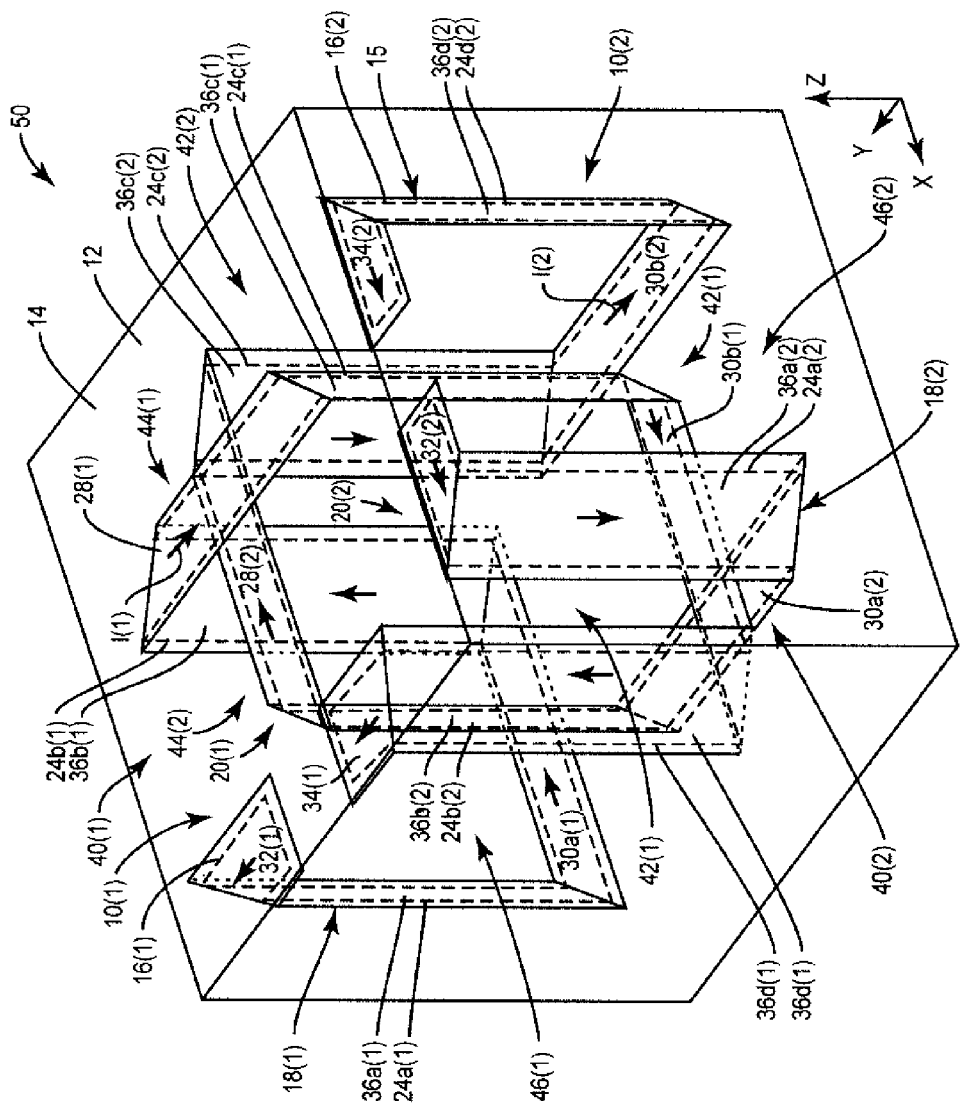

FIG. 3A and FIG. 3B illustrate one embodiment of an apparatus 50 formed by the conductive structure 15 of the substrate 12 shown in FIG. 1. The apparatus 50 includes the 3D inductor 10(1) and the 3D inductor 10(2) described above with respect to FIG. 2. However, in this embodiment, the 3D inductor 10(2) is oriented in a different manner than the 3D inductor 10(1). It should be noted that the 3D inductor 10(1) and the 3D inductor 10(2) have been drawn in a more simplified manner in FIG. 3A and FIG. 3B for the sake of clarity. The 3D inductors 10(1), 10(2) are weakly magnetically coupled to one another. In alternative embodiments, the 3D inductors 10(1), 10(2) may be provided to be moderately magnetically coupled or strongly magnetically coupled.

As shown in FIG. 3A, the 3D inductor 10(2) is rotated with respect to the 3D inductor 10(1) relative to the x-y plane. In this embodiment, the 3D inductor 10(2) is rotated with respect to the 3D inductor 10(1) relative to the x-y plane by approximately 90 degrees. Thus, the first turn 40(2) and the second turn 42(2) of the 3D inductor 10(2) each face the y-z plane while the third turn 44(2) and the segmented fourth turn 46(2) of the 3D inductor 10(2) each face the x-z plane. The 3D inductor 10(1) and the 3D inductor 10(2) also have x-y displacement. However, as shown in FIG. 3B, the 3D inductor 10(1) and the 3D inductor 10(2) also have a displacement relative to the z-axis. the displacement relative to the z-axis allows the connector plate 28(1) to cross the connector plate 28(2) and allows the connector plate 30b(1) to cross the connector plate 30a(2).

Referring now to FIG. 3B, the 3D inductor 10(2) is inserted into the 3D inductor 10(1) so that the conductive path 16(2) partially extends through the 3D volume 20(1). As such, the 3D inductor 10(2) is inserted into the 3D inductor 10(1) so that 3D volume 20(2) partially overlaps the 3D volume 20(1). In this embodiment, the third turn 44(1) of the 3D inductor 10(1) and the third turn 44(2) of the 3D inductor 10(2) are interweaved so that the elongated via column 24b(2) of the conductive path 16(2) extends through the 3D volume 20(1) and the interior of the 3D inductor 10(1). Additionally, the connector plate 28(2) partially extends through the 3D volume 20(1). Furthermore, the 3D inductor 10(1) is also inserted within the 3D inductor 10(2) so that the conductive path 16(1) partially extends through the 3D volume 20(2). More specifically, the second turn 42(1) is interwoven with the first turn 40(2). Thus, the elongated via column 24c(1) extends though the 3D volume 20(2). Additionally, the connector plate 30b(1) partially extends through the 3D volume 20(2). However, the connector plate 30b(2), the elongated via column 24c(1), the elongated via column 24c(2), and the elongated via column 24d(2) of the 3D inductor 10(2) are outside of the 3D volume 20(1) and at the exterior of the 3D inductor 10(1). Additionally, the elongated via column 24a(1), the elongated via column 24b(1), the connector plate 30a(1), and the elongated via column 24d(1) of the 3D inductor 10(1) are outside and at the exterior of the 3D inductor 10(2).

By inserting the 3D inductor 10(2) into the 3D inductor 10(1), the 3D inductor 10(2) can be magnetically coupled to the 3D inductor 10(1). As explained above, the 3D inductor 10(1) and the 3D inductor 10(2) shown in FIG. 3 are oriented so that the 3D inductor 10(2) is rotated by 90 degrees relative to the x-y-axis. Furthermore, the 3D inductor 10(1) and the 3D inductor 10(2) have a displacement relative to the x-axis, a displacement relative to the y-axis, and a displacement relative to the z-axis. The conductive path 16(1) is shaped as the 2D lobe 18(1) laid over the 3D volume 20(1) such that, in response to a current I(1) being provided through the conductive path 16(1), the conductive path 16(1) is configured to generate the magnetic field H(1) that predominately embraces the conductive path 16(1) along the interior of the 3D inductor 10(1), as shown by the magnetic field H described above with respect to FIG. 1. The conductive path 16(2) is shaped as the 2D lobe 18(2) laid over the 3D volume 20(2) such that, in response to a current I(2) being provided through the conductive path 16(2), the conductive path 16(2) is configured to generate a magnetic field H(2) that predominately embraces the conductive path 16(2) along the interior of the 3D inductor 10(2) in the same manner as the magnetic field H described above with respect to FIG. 1, except rotated relative to the x-y plane by 90 degrees.

With respect to the embodiment shown in FIG. 3B, the elongated via column 24c(1) of the 3D inductor 10(1) and the elongated via column 24b(2) of the 3D inductor 10(2) are magnetically coupled to one another. To do this, the third interior column surface of the elongated via column 24c(1) of the 3D inductor 10(1) faces the sixth interior column surface of the elongated via column 24b(2) of the 3D inductor 10(2). Thus, note that the first plane 36c(1) and the second plane 36b(2) are substantially parallel to one another. The magnetic field H(1) is generated so as to embrace the interior of the 3D inductor 10(1), as described above with respect to the magnetic field H shown in FIG. 1 except rotated by 90 degrees relative to the x-y plane. Accordingly, an x-y displacement between the third interior column surface of the elongated via column 24c(1) of the 3D inductor 10(1) and the sixth interior column surface of the elongated via column 24b(2) of the 3D inductor 10(2) determines an amount of magnetic coupling between the elongated via column 24c(1) of the 3D inductor 10(1) and the elongated via column 24b(2) of the 3D inductor 10(2).

Additionally, the third exterior column surface of the elongated via column 24c(1) of the 3D inductor 10(1) faces the eighth interior column surface of the elongated via column 24d(2) of the 3D inductor 10(2). Thus, note that the third plane 36c(1) and the fourth plane 36d(2) are substantially parallel to one another. The magnetic field H(2) is generated so as to embrace the interior of the 3D inductor 10(2), as described above with respect to the magnetic field H shown in FIG. 1 except rotated by 90 degrees with respect to the x-y plane. Accordingly, an x-y displacement between the third exterior column surface of the elongated via column 24c(1) of the 3D inductor 10(1) and the eighth interior column surface of the elongated via column 24d(2) of the 3D inductor 10(2) determines an amount of magnetic coupling between the elongated via column 24c(1) of the 3D inductor 10(1) and the elongated via column 24d(2) of the 3D inductor 10(2). In this embodiment, the x-y displacement between the third exterior column surface of the elongated via column 24c(1) of the 3D inductor 10(1) and the eighth interior column surface of the elongated via column 24d(2) of the second 3D inductor 10(2) is greater than the x-y displacement from a geometric centroid of the 3D inductor 10(2) to the third exterior column surface of the elongated via column 24c(1) of the 3D inductor 10(1) and the eighth interior column surface of the elongated via column 24d(2) of the second 3D inductor 10(2). Therefore, the elongated via column 24c(1) of the 3D inductor 10(1) and the elongated via column 24d(2) of the second 3D inductor 10(2) are not significantly magnetically coupled.

Furthermore, the first interior column surface of the elongated via column 24a(1) of the 3D inductor 10(1) faces the sixth exterior column surface of the elongated via column 24b(2) of the 3D inductor 10(2). Thus, note that the first plane 36a(1) and the second plane 36b(2) are substantially parallel to one another. The magnetic field H(1) is generated so as to embrace the interior of the 3D inductor 10(1), as described above with respect to the magnetic field H shown in FIG. 1. Accordingly, an x-y displacement between the first interior column surface of the elongated via column 24a(1) of the 3D inductor 10(1) and the sixth exterior column surface of the elongated via column 24b(2) of the 3D inductor 10(2) determines an amount of magnetic coupling between the elongated via column 24a(1) of the 3D inductor 10(1) and the elongated via column 24b(2) of the 3D inductor 10(2). In this embodiment, the x-y displacement between the first interior column surface of the elongated via column 24a(1) of the 3D inductor 10(1) and the sixth exterior column surface of the elongated via column 24b(2) of the second 3D inductor 10(2) is greater than the x-y displacement from a geometric centroid of the 3D inductor 10(1) to the first interior column surface of the elongated via column 24a(1) of the 3D inductor 10(1) and the sixth exterior column surface of the elongated via column 24b(2) of the second 3D inductor 10(2). Therefore, the elongated via column 24a(1) of the 3D inductor 10(1) and the elongated via column 24b(2) of the second 3D inductor 10(2) are not significantly magnetically coupled. Note however that in FIG. 3B, the first plane 36a(1), the second plane 36b(2), the third plane 36c(1), and the fourth plane 36d(2) all face one another and are oriented in the same manner. More specifically, a common diagonal can be drawn to intersect each of the first plane 36a(1), the first plane 36a(2), the third plane 36c(1), and the third plane 36c(2) in a substantially perpendicular manner.

As shown in FIG. 3B, the elongated via column 24b(1) and the elongated via column 24c(2) are adjacent to one another. However, the elongated via column 24b(1) and the elongated via column 24c(2) do not provide significant coupling. Rather, the second plane 36b(1) of elongated via column 24b(1) and the third plane 36c(2) of the elongated via column 24c(2) are oriented in substantially the same manner. As such, the second interior column surface of elongated via column 24b(1) and the seventh interior column surface of elongated via column 24c(2) are oriented in substantially the same manner, and the second exterior column surface of elongated via column 24b(1) and the seventh exterior column surface of elongated via column 24c(2) are oriented in substantially the same manner. Therefore, the elongated via column 24b(1) and the elongated via column 24c(2) have each of their thin sides next to one another, which does not provide significant coupling.

Furthermore, as shown in FIG. 3B, the elongated via column 24d(1) and the elongated via column 24a(2) are adjacent to one another. However, the elongated via column 24d(1) and the elongated via column 24a(2) do not provide significant coupling. Rather, the fourth plane 36d(1) of elongated via column 24d(1) and the first plane 36a(2) of the elongated via column 24a(2) are oriented in substantially the same manner. As such, the fourth interior column surface of elongated via column 24d(1) and the fifth interior column surface of elongated via column 24a(2) are oriented in substantially the same manner, and the fourth exterior column surface of elongated via column 24d(1) and the fifth exterior column surface of elongated via column 24a(2) are oriented in substantially the same manner. Therefore, the elongated via column 24d(1) and the elongated via column 24a(2) have each of their thin sides next to one another, which does not provide significant coupling.

Figure 4:
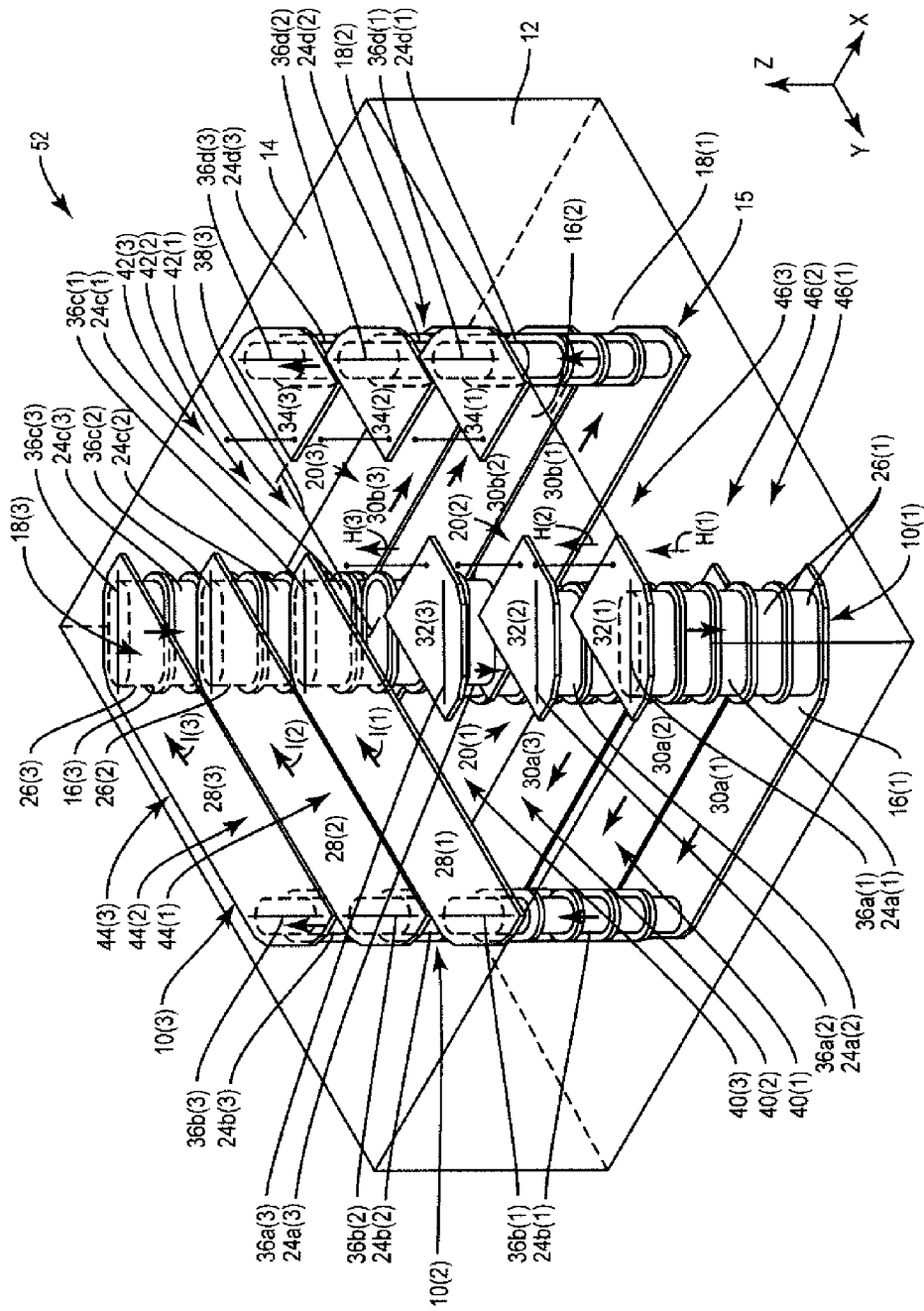
FIG. 4 illustrates an embodiment of three 3D inductors, like the 3D inductor shown in FIG. 1, that have been inserted into one another.

FIG. 4 illustrates one embodiment of an apparatus 52 formed by the conductive structure 15 of the substrate 12 shown in FIG. 1. In this embodiment, the apparatus 52 includes the 3D inductor 10(1), the 3D inductor 10(2), and a 3D inductor 10(3). The 3D inductor 10(1) and the 3D inductor 10(2) are the same as those described above with respect to FIG. 2 and are oriented in the manner as described above with respect to FIG. 2. Thus, the orientation and magnetic coupling between the elongated via columns 24a(1), 24b(1), 24c(1), and 24d(1) and the elongated via columns 24a(2), 24b(2), 24c(2), and 24d(2) is the same as described above with respect to FIG. 2.

With respect to the 3D inductor 10(3) shown in FIG. 4, the 3D inductor 10(3) is the same as the 3D inductor 10 shown in FIG. 1 such that the conductive path 16(3), the 2D lobe 18(3), the 3D volume 20(3), the elongated via column 24a(3), the elongated via column 24b(3), the elongated via column 24c(3), the elongated via column 24d(3), the solid via bars 26(3), the connector plate 28(3), the connector plate 30a(3), the connector plate 30b(3), the terminal plate 32(3), the terminal plate 34(3), the plane 36a(3), the plane 36b(3), the plane 36c(3), the plane 36d(3), the gap 38(3), the first turn 40(3), the second turn 42(3), the third turn 44(3), and the segmented fourth turn 46(3), are substantially the same as the conductive path 16, the 2D lobe 18, the 3D volume 20, the elongated via column 24a, the elongated via column 24b, the elongated via column 24c, the elongated via column 24d, the solid via bars 26, the connector plate 28, the connector plate 30a, the connector plate 30b, the terminal plate 32, the terminal plate 34, the plane 36a, the plane 36b, the plane 36c, the plane 36d, the gap 38, the first turn 40, the second turn 42, the third turn 44, and the segmented fourth turn 46 described above with respect to FIG. 1. The 3D inductor 10(3) is also inserted within the 3D inductor 10(1) and the 3D inductor 10(2). The 3D inductor 10(1) is the same as the 3D inductor 10(2) described above with respect to FIG. 2. The 3D inductor 10(1) is the same as the 3D inductor 10 shown in FIG. 1 such that the conductive path 16(1), the 2D lobe 18(1), the 3D volume 20(1), the elongated via column 24a(1), the elongated via column 24b(1), the elongated via column 24c(1), the elongated via column 24d(1), the solid via bars 26(1), the connector plate 28(1), the connector plate 30a(1), the connector plate 30b(1), the terminal plate 32(1), the terminal plate 34(1), the plane 36a(1), the plane 36b(1), the plane 36c(1), the plane 36d(1), the gap 38(1), the first turn 40(1), the second turn 42(1), the third turn 44(1), and the segmented fourth turn 46(1), are substantially the same as the conductive path 16, the 2D lobe 18, the 3D volume 20, the elongated via column 24a, the elongated via column 24b, the elongated via column 24c, the elongated via column 24d, the solid via bars 26, the connector plate 28, the connector plate 30a, the connector plate 30b, the terminal plate 32, the terminal plate 34, the plane 36a, the plane 36b, the plane 36c, the plane 36d, the gap 38, the first turn 40, the second turn 42, the third turn 44, and the segmented fourth turn 46 described above with respect to FIG. 1. The 3D inductor 10(2) also is the same as the 3D inductor 10 shown in FIG. 1 such that the conductive path 16(2), the 2D lobe 18(2), the 3D volume 20(2), the elongated via column 24a(2), the elongated via column 24b(2), the elongated via column 24c(2), the elongated via column 24d(2), the solid via bars 26(2), the connector plate 28(2), the connector plate 30a(2), the connector plate 30b(2), the terminal plate 32(2), the terminal plate 34(2), the plane 36a(2), the plane 36b(2), the plane 36c(2), the plane 36d(2), the gap 38(2), the first turn 40(2), the second turn 42(2), the third turn 44(2), and the segmented fourth turn 46(2), are substantially the same as the conductive path 16, the 2D lobe 18, the 3D volume 20, the elongated via column 24a, the elongated via column 24b, the elongated via column 24c, the elongated via column 24d, the solid via bars 26, the connector plate 28, the connector plate 30a, the connector plate 30b, the terminal plate 32, the terminal plate 34, the plane 36a, the plane 36b, the plane 36c, the plane 36d, the gap 38, the first turn 40, the second turn 42, the third turn 44, and the segmented fourth turn 46 described above with respect to FIG. 1.

As shown in FIG. 4, the 3D inductor 10(3) is inserted into the 3D inductor 10(1) and the 3D inductor 10(2) so that the conductive path 16(3) at least partially extends through the 3D volume 20(1) and the 3D volume 20(2). As such, more than two 3D inductors, namely the 3D inductors 10(1), 10(2), 10(3) are weakly magnetically coupled to one another and are disposed in a chain configuration. Note that in alternative embodiments any number of 3D inductors may be weakly magnetically coupled to one another in this manner. Furthermore, in alternative embodiments, the 3D inductors 10(1), 10(2) 10(3) may be provided to be moderately magnetically coupled or strongly magnetically coupled.

As such, the 3D inductor 10(3) is inserted into the 3D inductor 10(1) and the 3D inductor 10(2) so that 3D volume 20(3) partially overlaps the 3D volume 20(1) and the 3D volume 20(2). In this embodiment, the third turn 44(1) of the 3D inductor 10(1) and the first turn 40(3) of the 3D inductor 10(3) are interweaved so that the elongated via column 24a(3) of the conductive path 16(3) extends through the 3D volume 20(1) and the interior of the 3D inductor 10(1). As a result, the 3D inductor 10(1) is also inserted within the 3D inductor 10(3) so that the conductive path 16(1) partially extends through the 3D volume 20(3). More specifically, the second turn 42(1) is interweaved with the segmented fourth turn 46(3). Thus, the elongated via column 24c(1) extends though the 3D volume 20(3). However, the connector plate 28(3), the elongated via column 24c(3), and the elongated via column 24d(3) of the 3D inductor 10(3) are outside of the 3D volume 20(1) and at an exterior of the 3D inductor 10(1). Additionally, the elongated via column 24a(1), the connector plate 28(1), and the elongated via column 24d(1) of the 3D inductor 10(1) are outside and at an exterior of the 3D inductor 10(3).

Also, in this embodiment, the third turn 44(2) of the 3D inductor 10(2) and the first turn 40(3) of the 3D inductor 10(3) are interweaved so that the elongated via column 24a(3) of the conductive path 16(3) extends through the 3D volume 20(2) and the interior of the 3D inductor 10(2). As a result, the 3D inductor 10(2) is also inserted within the 3D inductor 10(3) so that the conductive path 16(2) partially extends through the 3D volume 20(3). More specifically, the second turn 42(2) is interweaved with the segmented fourth turn 46(3). Thus, the elongated via column 24c(2) extends though the 3D volume 20(3). However, the connector plate 28(3), the elongated via column 24c(3), and the elongated via column 24d(3) of the 3D inductor 10(3) are outside of the 3D volume 20(2) and at an exterior of the 3D inductor 10(2). Additionally, the elongated via column 24a(2), the connector plate 28(2), and the elongated via column 24d(2) of the 3D inductor 10(2) are outside and at an exterior of the 3D inductor 10(3).

By at inserting the 3D inductor 10(3) into the 3D inductor 10(1) and the 3D inductor 10(2), the 3D inductor 10(3) can be magnetically coupled to the 3D inductor 10(1) and to the 3D inductor 10(2). In this embodiment, the 3D inductor 10(3) is oriented in substantially the same manner as the 3D inductor 10(1) and the 3D inductor 10(2). However, the 3D inductor 10(3) has a displacement relative to the x-axis and a displacement relative to the y-axis with respect to the 3D inductor 10(2) and an even greater displacement relative to the x-axis and an even greater displacement relative to the y-axis with respect to the 3D inductor 10(1). There is no displacement with respect to respect to the z-axis. It should be noted that in alternative embodiments, the 3D inductor 10(3) may be oriented differently than the 3D inductor 10(1) and to the 3D inductor 10(2). Furthermore, in still other alternative embodiments, the 3D inductors 10(1), 10(2), 10(3) may all have different orientations.

The conductive path 16(3) is shaped as the 2D lobe 18(3) laid over the 3D volume 20(3) such that, in response to a current I(3) being provided through the conductive path 16(3), the conductive path 16(3) is configured to generate a magnetic field H(3) that predominately embraces the conductive path 16(3) along the interior of the 3D inductor 10(3), as shown by the magnetic field H described above with respect to FIG. 1.

With respect to the embodiment shown in FIG. 4, the elongated via column 24a(1) of the 3D inductor 10(1) and the elongated via column 24a(2) of the 3D inductor 10(2) are magnetically coupled to one another, as described above with respect to FIG. 2. Also, the elongated via column 24c(1) of the 3D inductor 10(1) and the elongated via column 24c(2) of the 3D inductor 10(2) are magnetically coupled to one another, as described above with respect to FIG. 2. Additionally, in this embodiment, the elongated via column 24a(2) of the 3D inductor 10(2) and the elongated via column 24a(3) of the 3D inductor 10(3) are magnetically coupled to one another, as described above with respect to FIG. 2. Also, the elongated via column 24c(2) of the 3D inductor 10(2) and the elongated via column 24c(3) of the 3D inductor 10(3) are magnetically coupled to one another.

As shown in FIG. 4, the elongated via column 24a(3) has a ninth interior column surface facing toward the interior of the 3D inductor 10(3) and a ninth exterior column surface that faces toward the exterior of the 3D inductor 10(3). The elongated via column 24b(3) has a tenth interior column surface facing toward the interior of the 3D inductor 10(3) and a tenth exterior column surface that faces toward the exterior of the 3D inductor 10(3). The elongated via column 24c(3) has an eleventh interior column surface facing toward the interior of the 3D inductor 10(3) and an eleventh exterior column surface that faces toward the exterior of the 3D inductor 10(3). The elongated via column 24d(3) has a twelfth interior column surface facing toward the interior of the 3D inductor 10(3) and a twelfth exterior column surface that faces toward the exterior of the 3D inductor 10(3).

As mentioned above, the elongated via column 24a(2) of the 3D inductor 10(2) and the elongated via column 24a(3) of the 3D inductor 10(3) are magnetically coupled to one another. To do this, the fifth interior column surface of the elongated via column 24a(2) of the 3D inductor 10(2) faces the ninth exterior column surface of the elongated via column 24a(3) of the 3D inductor 10(3). Thus, note that the first plane 36a(2) and the first plane 36a(3) are substantially parallel to one another. The magnetic field H(2) is generated so as to embrace the interior of the 3D inductor 10(2), as described above with respect to the magnetic field H shown in FIG. 1. Accordingly, an x-y displacement between the fifth interior column surface of the elongated via column 24a(2) of the 3D inductor 10(2) and the ninth exterior column surface of the elongated via column 24a(3) of the 3D inductor 10(3) determines an amount of magnetic coupling between the elongated via column 24a(2) of the 3D inductor 10(2) and the elongated via column 24a(3) of the 3D inductor 10(3).

Also, the elongated via column 24c(2) of the 3D inductor 10(2) and the elongated via column 24c(3) of the 3D inductor 10(3) are magnetically coupled to one another. To do this, the seventh exterior column surface of the elongated via column 24c(2) of the 3D inductor 10(2) faces the eleventh interior column surface of the elongated via column 24c(3) of the 3D inductor 10(3). Thus, note that the third plane 36c(2) and the third plane 36c(3) are substantially parallel to one another. The magnetic field H(3) is generated so as to embrace the interior of the 3D inductor 10(3), as described above with respect to the magnetic field H shown in FIG. 1. Accordingly, an x-y displacement between the seventh exterior column surface of the elongated via column 24c(2) of the 3D inductor 10(2) and the eleventh interior column surface of the elongated via column 24c(3) of the 3D inductor 10(3) determines an amount of magnetic coupling between the elongated via column 24c(2) of the 3D inductor 10(2) and the elongated via column 24c(3) of the 3D inductor 10(3). Note that in FIG. 4, the first plane 36a(1), first plane 36a(2), the first plane 36a(3), the third plane 36c(1), the third plane 36c(2), and the third plane 36c(3) all face one another and are oriented in the same manner. More specifically, a common diagonal can be drawn to intersect each of the first plane 36a(1), first plane 36a(2), the first plane 36a(3), the third plane 36c(1), the third plane 36c(2), and the third plane 36c(3) in a substantially perpendicular manner.

The elongated via column 24b(2) and the elongated via column 24b(3) are adjacent to one another. However, the elongated via column 24b(2) and the elongated via column 24b(3) do not provide significant coupling. Rather, the second plane 36b(2) of elongated via column 24b(2) and the second plane 36b(3) of the elongated via column 24b(3) are oriented in substantially the same manner. As such, the sixth interior column surface of elongated via column 24b(2) and the tenth interior column surface of elongated via column 24b(3) are oriented in substantially the same manner, and the sixth exterior column surface of elongated via column 24b(2) and the tenth exterior column surface of elongated via column 24b(3) are oriented in substantially the same manner. Therefore, the elongated via column 24b(2) and the elongated via column 24b(3) have each of their thin sides next to one another, which does not provide significant coupling.

The elongated via column 24d(2) and the elongated via column 24d(3) are adjacent to one another. However, the elongated via column 24d(2) and the elongated via column 24d(3) do not provide significant coupling. Rather, the fourth plane 36d(2) of elongated via column 24d(2) and the fourth plane 36d(3) of the elongated via column 24d(3) are oriented in substantially the same manner. As such, the eighth interior column surface of elongated via column 24d(2) and the twelfth interior column surface of elongated via column 24d(3) are oriented in substantially the same manner, and the eighth exterior column surface of elongated via column 24d(2) and the twelfth exterior column surface of elongated via column 24d(3) are oriented in substantially the same manner. Therefore, the elongated via column 24d(2) and the elongated via column 24d(3) have each of their thin sides next to one another, which does not provide significant coupling.

Figure 5:
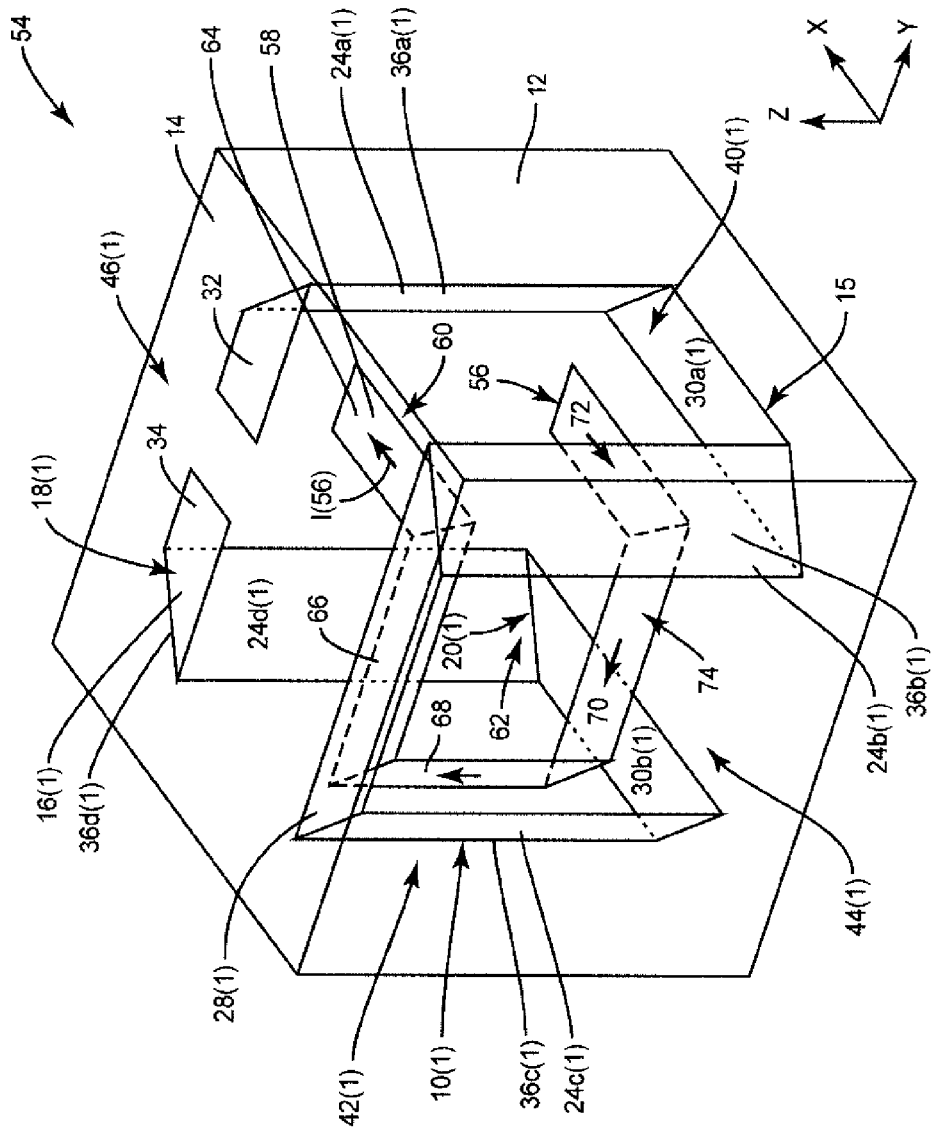
FIG. 5 illustrates an embodiment of two 3D inductors, where one of the 3D inductors is inserted entirely within the other 3D inductor.

FIG. 5 illustrates another embodiment of an apparatus 54 formed by the conductive structure 15 of the substrate 12 shown in FIG. 1. In this embodiment, the apparatus 54 includes the 3D inductor 10(1) provided and oriented in the same manner described above with respect to FIG. 2 and a 3D inductor 56. Note that the 3D inductor 10(1) has been simplified in the illustration shown in FIG. 2. The 3D inductor 56 has a conductive path 58, which extends entirely within the 3D volume 20(1) within the interior of the 3D inductor 10(1). The conductive path 58 is shaped as a 2D lobe 60, which has been folded over a 3D volume 62. The 3D volume 62 is entirely within the 3D volume 20(1). In this example, the 3D volume 20(1) is a cube, but in alternative embodiments may be of any shape. The conductive path 58 of the 3D inductor 56 is formed by a connector plate 64, a connector plate 66 connected to the connector plate 64, an elongated column via 68 that connects at vertical side SA to the connector plate 66, a connector plate 70 that connects at vertical side SB to the elongated column via 68, and a connector plate 72.

The connector plate 64 and the connector plate 72 both extend in the x-direction but connector plate 64 is provided at vertical side SA and connector plate 70 is provided at vertical side SB. Also, the connector plate 66 and the connector plate 70 both extend in the y-direction but connector plate 70 is provided at vertical side SA, and connector plate 70 is provided at vertical side SB. A current I(56) is shown as it propagates through the conductive path 58. The elongated column via 68 connects the connector plate 66 and the connector plate 70 so that the current I(56) flows in opposite directions through the connector plate 66 and the connector plate 70. Thus, the current I(56) also flows in opposite directions through connector plate 64 and the connector plate 72.

The elongated column via 68, the connector plate 66, and the connector plate 70 of the conductive path 58 is shaped to form a turn 74 that faces the third turn 44(1) of the 3D inductor 10(1). However, the turn 74 has a transverse rotational orientation with respect to the y-z plane. The turn 74 may be strongly magnetically coupled to the third turn 44(1). Similarly, the connector plates 64, 66 may be may be strongly magnetically coupled to the first turn 40(1) of the 3D inductor 10(1). However, the magnetic coupling provided between the turn 74 and the third turn 44(1) opposes the magnetic coupling provided between the connector plates 64, 66 and the first turn 40(1). Thus, overall, the 3D inductor 10(1) and the 3D inductor 56 may be weakly magnetically coupled. The distance between the 3D inductor 10(1) and the 3D inductor 56 along with the dimensions of the 3D inductor 10(1) and the 3D inductor 56 can thus be selected to provide a desired magnetic coupling coefficient between the 3D inductor 10(1) and the 3D inductor 56. In alternative embodiments, the 3D inductors 10(1), 56 may be provided to be moderately magnetically coupled or strongly magnetically coupled.

Figure 6:
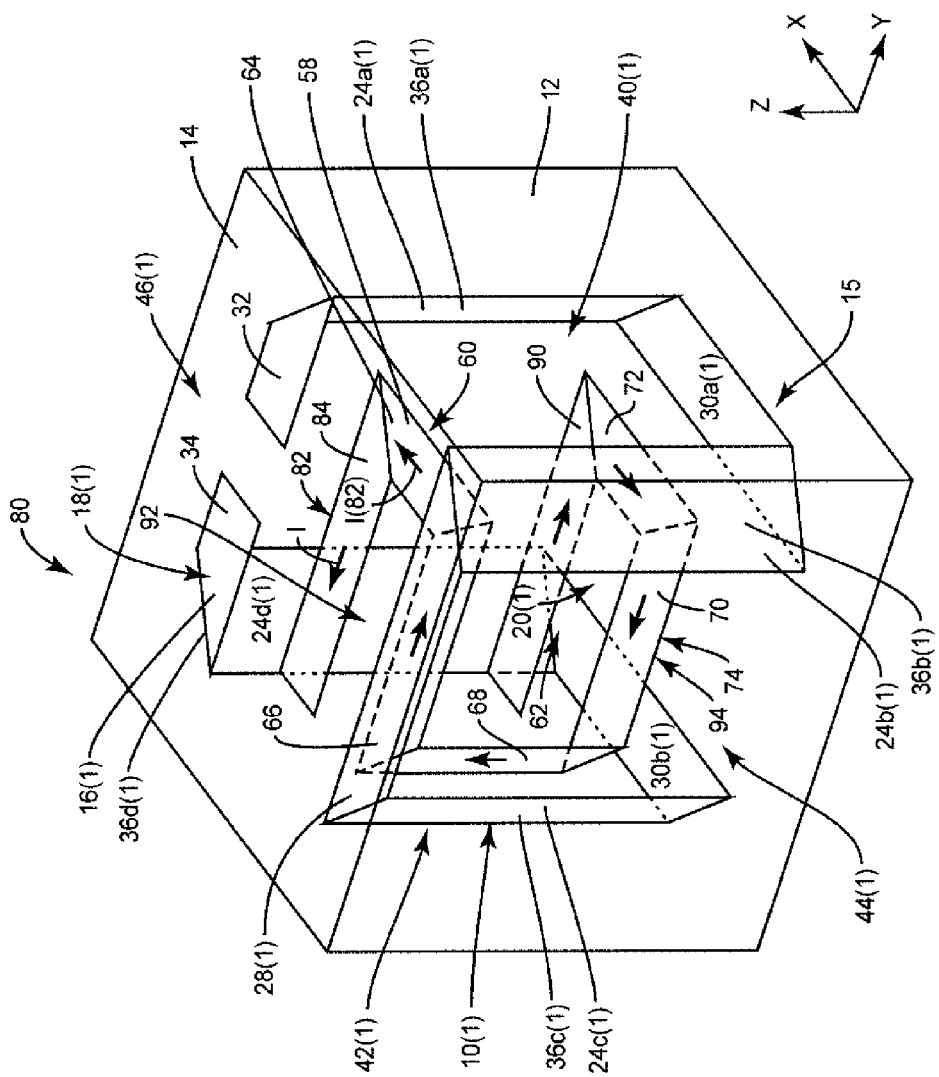
FIG. 6 illustrates another embodiment of two 3D inductors, where one of the 3D inductors is inserted entirely within the other 3D inductor, and the two 3D inductors have two pairs of opposing turns that face one another.

FIG. 6 illustrates another embodiment of an apparatus 80 formed by the conductive structure 15 of the substrate 12 shown in FIG. 1. In this embodiment, the apparatus 80 includes the 3D inductor 10(1) provided and oriented in the same manner described above with respect to FIG. 2 and a 3D inductor 82. Note that the 3D inductor 10(1) has been simplified in the illustration shown in FIG. 2. The 3D inductor 82 has a conductive path 84 which extends entirely within the 3D volume 20(1) within the interior of the 3D inductor 10(1). The conductive path 84 is shaped as a 2D lobe 86, which has been folded over the 3D volume 62 as described in FIG. 5. The 3D inductor 82 and the conductive path 84 are the same as the 3D inductor 56 and the conductive path 58 described above with respect to FIG. 5, except that the 3D inductor 82 and the conductive path 84 further include a connector plate 88 and a connector plate 90. Since the 3D inductor 82 includes the connector plate 64, the connector plate 66, the elongated via column 68, the conductive plate 70 and the conductive plate 72, the elongated column via 68, the connector plate 66, and the connector plate 70 of the conductive path 84 are shaped to form the turn 74 that faces the third turn 44(1) of the 3D inductor 10(1), as described above with respect to FIG. 5. However, in this embodiment, the connector plate 88 is connected to the connector plate 64 so that the connector plate 88, the connector plate 64, and the connector plate 66 form a turn 92. The connector plate 90 is connected to the connector plate 70 so that the connector plate 90, the connector plate 70, and the connector plate 72 form a turn 94.

The connector plate 64 and the connector plate 72 both extend in the x-direction but connector plate 64 is provided at vertical side SA and connector plate 70 is provided at vertical side SB. Also, the connector plate 66 and the connector plate 70 both extend in the y-direction but connector plate 70 is provided at vertical side SA and connector plate 70 is provided at vertical side SB. A current I(82) is shown as it propagates through the conductive path 84. The elongated column via 68 connects the connector plate 66 and the connector plate 70 so that the current I(82) flows in opposite directions through the connector plate 66 and the connector plate 70. Thus, the current I(82) also flows in opposite directions through connector plate 64 and the connector plate 72.

The elongated column via 68, the connector plate 66, and the connector plate 70 of the conductive path 84 are shaped to form a turn 74 that faces the third turn 44(1) of the 3D inductor 10(1). However, the turn 74 has a transverse rotational orientation with respect to the y-z plane. The turn 74 may be strongly magnetically coupled to the third turn 44(1). Similarly, the connector plates 64, 66 may be may be strongly magnetically coupled to the first turn 40(1) of the 3D inductor 10(1). However, the magnetic coupling provided between the turn 74 and the third turn 44(1) opposes the magnetic coupling provided between the connector plates 64, 66 and the first turn 40(1). Thus, overall the 3D inductor 10(1) and the 3D inductor 82 may be weakly magnetically coupled. The distance between the 3D inductor 10(1) and the 3D inductor 82 along with the dimensions of the 3D inductor 10(1) and the 3D inductor 82 can thus be selected to provide a desired magnetic coupling coefficient between the 3D inductor 10(1) and the 3D inductor 82. The turn 92 and the turn 94 face one another and a symmetrical relative to the x-y plane. The x-y plane is transverse to the x-z plane and the x-y plane. In this manner, the turns 92, 94 can be strongly coupled to the turns 40(1), 42(1) but the opposing magnetic coupling between the different segments of the 3D inductors 10(1), 82 can thus provide overall weak magnetic coupling between the 3D inductors 10(1), 82. In alternative embodiments, the 3D inductors 10(1), 82 may be provided to be moderately magnetically coupled or strongly magnetically coupled.

Figure 7:
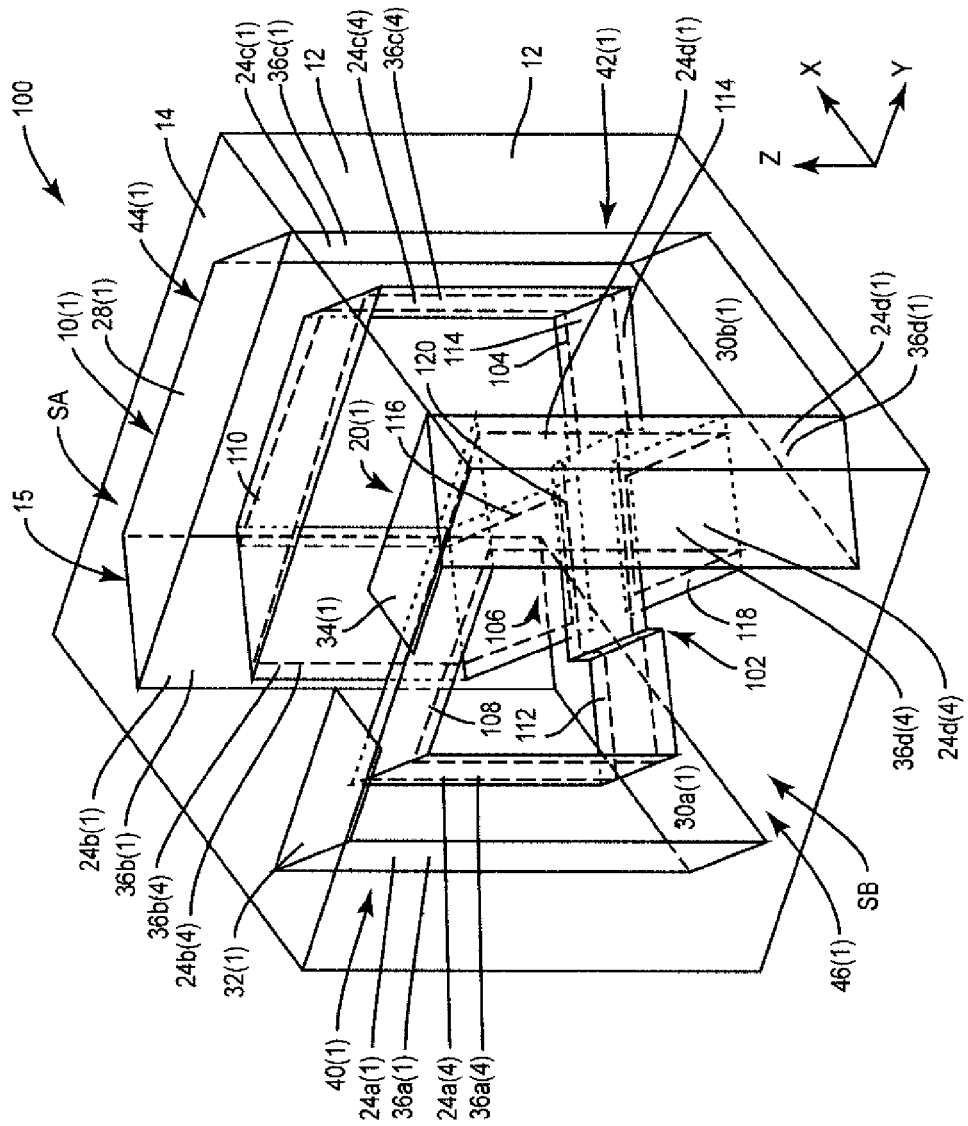
FIG. 7 illustrates still another embodiment of two 3D inductors, where one of the 3D inductors is inserted entirely within the other 3D inductor, and a bridge is utilized by the inserted 3D inductor.

FIG. 7 illustrates another embodiment of an apparatus 100 formed by the conductive structure 15 of the substrate 12 shown in FIG. 1. In this embodiment, the apparatus 100 includes the 3D inductor 10(1) provided and oriented in the same manner described above with respect to FIG. 2 and a 3D inductor 102. Note that the 3D inductor 10(1) has been simplified in the illustration shown in FIG. 7. The 3D inductor 102 has a conductive path 104 that extends entirely within the 3D volume 20(1) within the interior of the 3D inductor 10(1). The conductive path 104 is shaped to define an interior of a 3D volume 106. The conductive path 104 of the 3D inductor 102 includes an elongated via column 24a(4), 24b(4), 24c(4), and 24d(4), which are the same as the elongated via column 24a, 24b, 24c, and 24d described above with respect to FIG. 1, except that the elongated via column 24a(4), 24b(4), 24c(4), and 24d(4), are proportioned so as to be smaller so as to fit inside the 3D volume 20(1).

In this embodiment, a connector plate 108 connects the elongated via column 24a(4) to the elongated via column 24b(4) on the vertical side SA. A connector plate 110 connects the elongated via column 24c(4) to the elongated via column 24d(4) on the vertical side SA. A connector plate 112 is connected to the elongated via column 24a(4) on the vertical side SB. The connector plate 112 extends toward the elongated via column 24c(4). A connector plate 114 is connected to the elongated via column 24a(4) on the vertical side SB. The connector plate 114 extends toward the elongated via column 24a(4). A terminal plate 116 is connected to the elongated via column 24b(4) on the vertical side SB. The terminal plate 116 extends toward the elongated via column 24d(4). A terminal plate 118 is connected to the elongated via column 24d(4) on the vertical side SB. The terminal plate 118 extends toward the elongated via column 24b(4). The terminal plates 116, 118 however are not connected but rather form a gap.

To connect the connector plates 112, 114 without intersecting the terminal plates 116, 118 or closing the gap formed by the terminal plates 116, 118, a bridge is connected between the connector plate 112 and the connector plate 114. The bridge 120 extends around the terminal plates 116, 118. In this embodiment, the bridge 120 goes over the terminal plates 116, 118. In other embodiments, the bridge 120 goes under the connector plates 112, 114. The 3D inductors 10(1), 102 shown in FIG. 7 are weakly magnetically coupled to one another. In alternative embodiments, the 3D inductors 10(1), 102 may be provided to be moderately magnetically coupled or strongly magnetically coupled.

Figure 8:
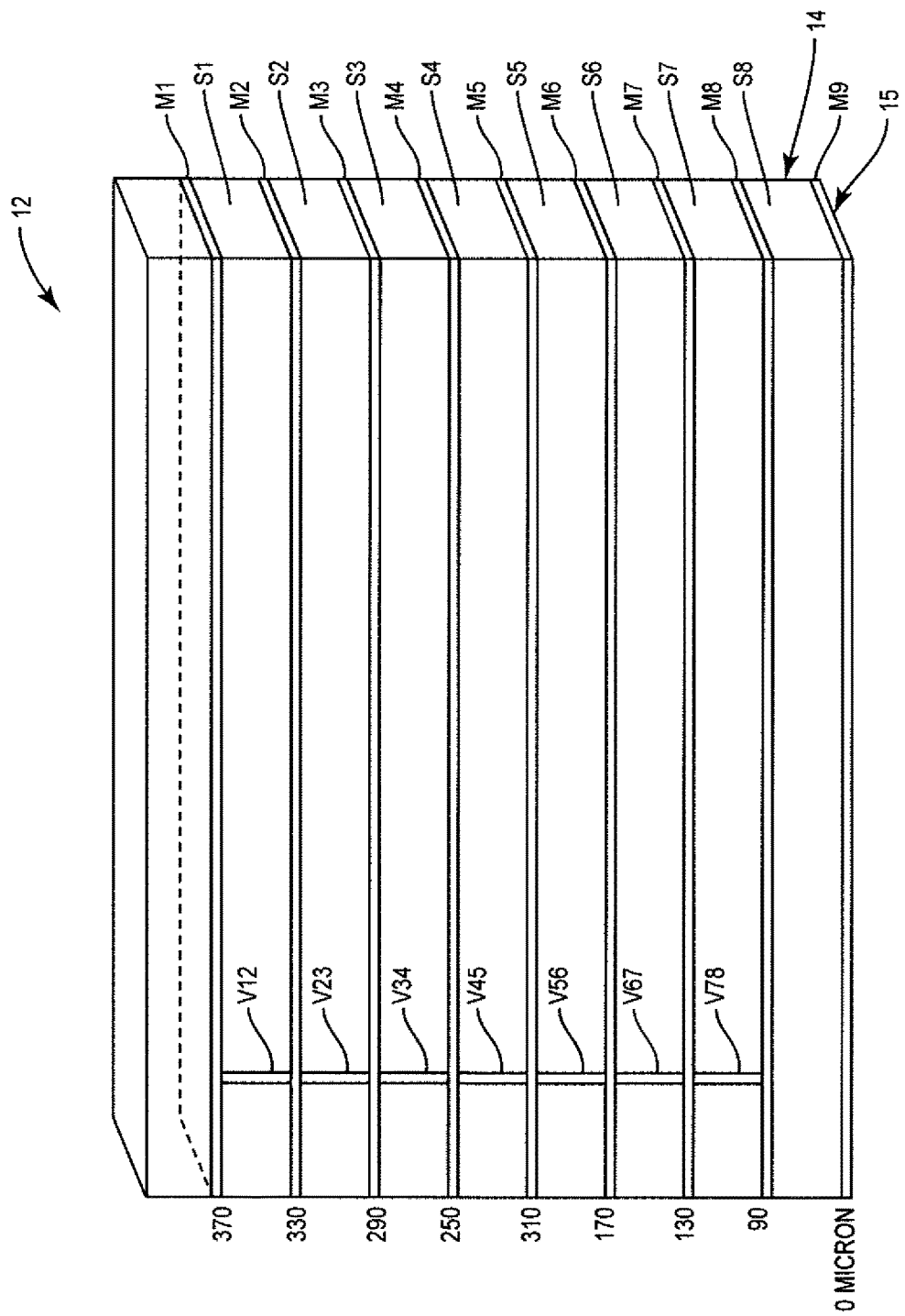
FIG. 8 illustrates an embodiment of a multi-layered substrate having a conductive structure which may be utilized to form the 3D inductors shown in FIGS. 1-7.

FIG. 8 illustrates an embodiment of the substrate 12 having the conductive structure 15, which may be utilized to form any one of the 3D inductors discussed above. In this embodiment, the substrate 12 has a multi-level substrate body so that the substrate body is made of substrate layers S1-S9. On and between each of the substrate layers S1-S9, the conductive structure 15 has metallic layers M1-M9. Each of the metallic layers M1-M9 may be connected by solid vias. The dimensions of the structure allow for the 3D inductors described above to be compatible with 0.065 mm integrated circuit (IC) package technology.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a first three dimensional (3D) inductor having a first conductive path shaped as a first two dimensional (2D) lobe laid over a first 3D volume, wherein:
      the first 3D inductor comprises a first elongated via column that forms part of the first conductive path;
      the first elongated via column is elongated along a first plane to define a first column surface that faces toward an interior of the first 3D inductor; and
      the first 2D lobe is open so as to define a first gap; and
   a second 3D inductor having a second conductive path shaped as a second 2D lobe laid over a second 3D volume, wherein:
      the second 3D inductor is inserted into the first 3D inductor so that the second 3D volume at least partially overlaps the first 3D volume;
      the second 3D inductor comprises a second elongated via column that forms part of the second conductive path;
      the second elongated via column extends through the first 3D volume;
      the second elongated via column is elongated along a second plane to define a second column surface that faces toward an exterior of the second 3D inductor and towards the first column surface of the first elongated via column;
      the second 2D lobe is open so as to define a second gap; and
      the first gap does not coincide with the second gap.

2. The apparatus of claim 1 wherein the first conductive path is shaped as the first 2D lobe laid over the first 3D volume such that, in response to a current being provided through the first conductive path, the first conductive path is configured to generate a magnetic field that predominately embraces the first conductive path along the interior of the first 3D inductor.

3. The apparatus of claim 1 wherein:
   the second conductive path only partially extends through the first 3D volume; and
   the first 3D inductor is also inserted within the second 3D inductor so that the first conductive path partially extends through the second 3D volume.

4. The apparatus of claim 1 wherein the first conductive path and the second conductive path are interleaved such that the second conductive path only partially extends through the first 3D volume and the first conductive path partially extends through the second 3D volume.

5. The apparatus of claim 1 wherein the first plane and the second plane are oriented substantially the same but are positioned so that the first column surface and the second column surface are displaced.

6. The apparatus of claim 1 wherein:
   the first 3D inductor further comprises a third elongated via column that forms another part of the first conductive path, wherein the third elongated via column extends through the second 3D volume and wherein the third elongated via column is elongated along a third plane to define a third column surface that faces toward an exterior of the first 3D inductor; and
   the second 3D inductor further comprises a fourth elongated via column that forms another part of the second conductive path, wherein the fourth elongated via column is elongated along a fourth plane to define a fourth column surface that faces toward an interior of the second 3D inductor and towards the third column surface of the third elongated via column.

7. The apparatus of claim 6 wherein the first plane, the second plane, the third plane and the fourth plane are oriented substantially the same but are positioned so that the first column surface, the second column surface, the third column surface, and the fourth column surface are displaced.

8. An apparatus comprising:
   a first three dimensional (3D) inductor having a first conductive path shaped as a first two dimensional (2D) lobe laid over a first 3D volume, wherein:
      the first 3D inductor comprises a first elongated via column, a second elongated via column, a third elongated via column, a fourth elongated via column, a first connector plate, a second connector plate, and a third connector plate to form the first conductive path;
      the first connector plate connects the first elongated via column and the second elongated via column;
      the second connector plate connects the third elongated via column and the fourth elongated via column;

the third connector plate connects the second elongated via column to the third elongated via column; and the first 2D lobe is open so as to define a first gap; and a second 3D inductor having a second conductive path shaped as a second 2D lobe laid over a second 3D volume, wherein:
the second 3D inductor comprises a fifth elongated via column, a sixth elongated via column, a seventh elongated via column, an eighth elongated via column, a fourth connector plate, a fifth connector plate, and a sixth connector plate to form the second conductive path;
the fourth connector plate connects the fifth elongated via column and the sixth elongated via column;
the fifth connector plate connects the seventh elongated via column and the eighth elongated via column;
the sixth connector plate connects the sixth elongated via column to the seventh elongated via column;
the second 3D inductor is inserted into the first 3D inductor so that the second 3D volume at least partially overlaps the first 3D volume;
the second 2D lobe is open so as to define a second gap; and
the first gap does not coincide with the second gap.

9. The apparatus of claim 8 wherein:
the fifth elongated via column of the second conductive path of the second 3D inductor extends through the first 3D volume; and
the sixth elongated via column, the seventh elongated via column, the eighth elongated via column, the fifth connector plate, and the sixth connector plate of the second conductive path of the second 3D inductor are outside of the first 3D volume.

10. The apparatus of claim 8 wherein:
the first elongated via column has a first interior column surface facing toward an interior of the first 3D inductor and a first exterior column surface that faces toward an exterior of the first 3D inductor;
the second elongated via column has a second interior column surface facing toward the interior of the first 3D inductor and a second exterior column surface that faces toward the exterior of the first 3D inductor;
the third elongated via column has a third interior column surface facing toward the interior of the first 3D inductor and a third exterior column surface that faces toward the exterior of the first 3D inductor;
the fourth elongated via column has a fourth interior column surface facing toward the interior of the first 3D inductor and a fourth exterior column surface that faces toward the exterior of the first 3D inductor;
the fifth elongated via column has a fifth interior column surface facing toward an interior of the second 3D inductor and a fifth exterior column surface that faces toward an exterior of the second 3D inductor, the first interior column surface faces the fifth exterior column surface;
the sixth elongated via column has a sixth interior column surface facing toward the interior of the second 3D inductor and a sixth exterior column surface that faces toward the exterior of the second 3D inductor, wherein the second elongated via column and the sixth elongated via column are adjacent to one another such that the second interior column surface and the sixth interior column surface are oriented in substantially the same manner and such that the second exterior column surface and the sixth exterior column surface are oriented in substantially the same manner;
the seventh elongated via column has a seventh interior column surface facing toward the interior of the second 3D inductor and a seventh exterior column surface that faces toward the exterior of the second 3D inductor, wherein the third exterior column surface faces the seventh interior column surface; and
the eighth elongated via column has an eighth interior column surface facing toward the interior of the second 3D inductor and a eighth exterior column surface that faces toward the exterior of the second 3D inductor, wherein the fourth elongated via column and the eighth elongated via column are adjacent to one another such that the fourth interior column surface and the eighth interior column surface are oriented in substantially the same manner and such that the fourth exterior column surface and the eighth exterior column surface are oriented in substantially the same manner.

11. The apparatus of claim 10 wherein more than two 3D inductors are disposed in a chain configuration.

12. The apparatus of claim 8 wherein:
the sixth elongated via column of the second conductive path of the second 3D inductor extends through the first 3D volume; and
the fifth elongated via column, the seventh elongated via column, the eighth elongated via column, and the fifth connector plate of the second conductive path of the second 3D inductor are outside of the first 3D volume.

13. The apparatus of claim 8 wherein:
the first elongated via column has a first interior column surface facing toward an interior of the first 3D inductor and a first exterior column surface that faces toward an exterior of the first 3D inductor;
the second elongated via column has a second interior column surface facing toward the interior of the first 3D inductor and a second exterior column surface that faces toward the exterior of the first 3D inductor;
the third elongated via column has a third interior column surface facing toward the interior of the first 3D inductor and a third exterior column surface that faces toward the exterior of the first 3D inductor;
the fourth elongated via column has a fourth interior column surface facing toward the interior of the first 3D inductor and a fourth exterior column surface that faces toward the exterior of the first 3D inductor;
the fifth elongated via column has a fifth interior column surface facing toward an interior of the second 3D inductor and a fifth exterior column surface that faces toward an exterior of the second 3D inductor, the fourth elongated via column and the fifth elongated via column are adjacent to one another such that the fourth interior column surface and the fifth interior column surface are oriented in substantially the same manner and such that the fourth exterior column surface and the fifth exterior column surface are oriented in substantially the same manner;
the sixth elongated via column has a sixth interior column surface facing toward the interior of the second 3D inductor and a sixth exterior column surface that faces toward the exterior of the second 3D inductor, wherein the sixth interior column surface faces the third interior column surface and the sixth exterior column surface faces the first interior column surface;
the seventh elongated via column has a seventh interior column surface facing toward the interior of the second 3D inductor and a seventh exterior column surface that faces toward the exterior of the second 3D inductor, the second elongated via column and the seventh elongated via column are adjacent to one another such that the second interior column surface and the seventh interior column surface are oriented in substantially the same manner and such that the second exterior column surface and the seventh exterior column surface are oriented in substantially the same manner; and the eighth elongated via column has an eighth interior column surface facing toward the interior of the second 3D inductor and an eighth exterior column surface that faces toward the exterior of the second 3D inductor, wherein the eighth interior column surface faces the third exterior column surface.

14. The apparatus of claim 1 further comprising a third 3D inductor having a third conductive path, wherein the third 3D inductor is inserted into the first 3D inductor so that the third conductive path at least partially extends through the first 3D volume.

15. The apparatus of claim 1 wherein the second 3D inductor has the second conductive path so that the second conductive path extends entirely within the first 3D volume.

16. The apparatus of claim 15 wherein:
the first 3D inductor has the first conductive path such that the first conductive path is shaped to form a first turn, a second turn, and a third turn, wherein the first turn and the second turn face one another and are symmetrical relative to a first plane and wherein the first turn is connected to the second turn so as to form the third turn such that the third turn faces a second plane, wherein the second plane is traverse to the first plane; and
the second conductive path is shaped to form a fourth turn that faces the third turn but the fourth turn has a transverse rotational orientation with respect to the third turn relative to the second plane.

17. The apparatus of claim 15 wherein:
the first 3D inductor has the first conductive path such that the first conductive path is shaped to form a first turn, a second turn, and a third turn, wherein the first turn and the second turn face one another and are symmetrical relative to a first plane and wherein the first turn is connected to the second turn so as to form the third turn such that the third turn faces a second plane that is transverse to the first plane; and
the second 3D inductor has the first conductive path such that the second conductive path is shaped to form a fourth turn, a fifth turn, and a sixth turn, wherein the fourth turn and the fifth turn face one another and are symmetrical relative to a third plane that is transverse to the first plane and the second plane and wherein the fourth turn is connected to the fifth turn so as to form the sixth turn that faces the third turn but the sixth turn has a transverse rotational orientation with respect to the to the third turn relative to the second plane.

18. The apparatus of claim 15 wherein:
the first 3D inductor comprises a first elongated via column, a second elongated via column, a third elongated via column, a fourth elongated via column, a first connector plate, a second connector plate, and a third connector plate to form the first conductive path wherein:
the first connector plate connects the first elongated via column and the second elongated via column;
the second connector plate connects the third elongated via column and the fourth elongated via column; and
the third connector plate connects the second elongated via column to the third elongated via column; and
the second 3D inductor comprises a fifth elongated via column, a sixth elongated via column, a seventh elongated via column, an eighth elongated via column, a fourth connector plate, a fifth connector plate, a sixth connector plate, a seventh connector plate, a first terminal plate a second terminal plate and a bridge to form the second conductive path wherein:
the fourth connector plate connects the fifth elongated via column and the eighth elongated via column;
the fifth connector plate connects the sixth elongated via column and the seventh elongated via column;
the first terminal plate connects to the second elongated via column and extends toward the eighth elongated via column;
the second terminal plate connected to eighth elongated via column and extends toward the second elongated via column, wherein the first terminal plate and the second terminal plate form a gap;
the sixth connector plate connects to the fifth elongated via column and extends towards the seventh elongated via column;
the seventh connector plate connects to the seventh via column and extends towards the first elongated via column; and
the bridge is connects the sixth connector plate to the seventh connector plate, wherein the configured to go around the first connector plate and the second connector plate.

19. The apparatus of claim 1 further comprising a substrate having a substrate body and a metallic structure integrated into the substrate body wherein the first 3D inductor and the second 3D inductor are formed by the metallic structure.

20. The apparatus of claim 1 wherein at least one of the first 3D inductor and the second 3D inductor has two or more turns.

* * * * *